United States Patent
Kwon et al.

(10) Patent No.: US 11,561,711 B2
(45) Date of Patent: Jan. 24, 2023

(54) MEMORY DEVICE PERFORMING CONFIGURABLE MODE SETTING AND METHOD OF OPERATING THE SAME

(71) Applicant: Samsung Electronics Co., Ltd., Suwon-si (KR)

(72) Inventors: Youngcheon Kwon, Hwaseong-si (KR); Jaesan Kim, Suwon-si (KR); Jemin Ryu, Seoul (KR); Jaeyoun Youn, Seoul (KR); Haesuk Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 58 days.

(21) Appl. No.: 17/335,307

(22) Filed: Jun. 1, 2021

(65) Prior Publication Data

US 2022/0075541 A1    Mar. 10, 2022

(30) Foreign Application Priority Data

Sep. 7, 2020 (KR) ......................... 10-2020-0114045

(51) Int. Cl.
*G06F 3/06* (2006.01)
*G11C 7/10* (2006.01)
(Continued)

(52) U.S. Cl.
CPC .......... *G06F 3/0634* (2013.01); *G06F 3/0604* (2013.01); *G06F 3/0659* (2013.01);
(Continued)

(58) Field of Classification Search
None
See application file for complete search history.

(56) References Cited

U.S. PATENT DOCUMENTS 5,710,911 A    1/1998   Walsh et al.
8,076,764 B2   12/2011  Yamada et al.
(Continued)

FOREIGN PATENT DOCUMENTS

TW    201409467 A    3/2014

OTHER PUBLICATIONS

Extended European Search Report corresponding to EP 21188918.3; dated Feb. 3, 2022 (12 pages).
(Continued)

*Primary Examiner* — Elias Mamo
(74) *Attorney, Agent, or Firm* — Myers Bigel, P.A.

(57) ABSTRACT

A memory device according to an aspect may include a memory cell array including a first bank region and a second bank region each including a plurality of banks; an operation logic including one or more first processing elements (PEs) corresponding to the first bank region and one or more second PEs corresponding to the second bank region; a control logic configured to control modes of the first bank region and the second bank region based on externally sourced setting information; first and second mode signal generators configured to control enabling the first PEs, wherein the first mode signal generator is configured to output the first mode signal to enable the first PEs and the second mode signal generator is configured to output the second mode signal to disable the second PEs responsive to the first bank region being set to an operation mode and the second bank region being set to a normal mode.

20 Claims, 18 Drawing Sheets

(51) Int. Cl.
*G11C 7/22* (2006.01)
*H01L 25/18* (2006.01)

(52) U.S. Cl.
CPC .......... *G06F 3/0673* (2013.01); *G11C 7/1069* (2013.01); *G11C 7/222* (2013.01); *H01L 25/18* (2013.01)

(56) References Cited

U.S. PATENT DOCUMENTS

| | | |
|---|---|---|
| 9,030,904 B2 | 5/2015 | Lee |
| 9,953,702 B2 | 4/2018 | Son |
| 10,474,600 B2 | 11/2019 | Malladi et al. |
| 10,503,641 B2 | 12/2019 | Boyer et al. |
| 10,545,860 B2 | 1/2020 | Malladi et al. |
| 10,553,260 B2 | 2/2020 | Shin et al. |
| 2014/0298056 A1* | 10/2014 | Seki ............... G06F 1/3275 713/320 |
| 2017/0255390 A1* | 9/2017 | Chang ............ G06F 3/0605 |
| 2018/0053545 A1 | 2/2018 | Son |
| 2019/0163650 A1 | 5/2019 | Kim et al. |
| 2020/0201418 A1 | 6/2020 | Richter et al. |
| 2020/0334171 A1* | 10/2020 | Meier ............. G06F 21/6218 |
| 2021/0011669 A1* | 1/2021 | Park ................ G11C 11/56 |
| 2021/0109668 A1* | 4/2021 | Kale ............... G06F 3/0673 |

OTHER PUBLICATIONS

Chi, Ping, et al., "PRIME: a novel processing-in-memory architecture for neural network computation in ReRAM-based main memory", ACM SIGARCH Computer Architecture News, 44(3), 2016, 27-39.

* cited by examiner

FIG. 11

| MR8 | MA[0:4] | OP7 | OP6 | OP5 | OP4 | OP3 | OP2 | OP1 | OP0 |
|---|---|---|---|---|---|---|---|---|---|
| | 01000 | BA3"H" | BA3"L" | PC1 | PC0 | SID1 | SID0 | Mode exit | Mode entry |
| (1) Default (normal mode) | | 0 | 0 | 0 | 0 | 0 | 0 | 0 | 0 |
| (2) ALL BANKS OF SID0 AND PC0 ENTER PIM MODE | | 1 | 1 | 0 | 1 | 0 | 1 | 0 | 1 |
| (3) ALL BANKS OF SID0 & SID1 AND PC0 ENTER PIM MODE | | 1 | 1 | 0 | 1 | 1 | 1 | 0 | 1 |
| (4) ONLY BOTTOM REGION OF SID0, PC0 ENTER PIM MODE | | 1 | 0 | 1 | 1 | 0 | 1 | 0 | 1 |
| (5) ONLY BOTTOM REGION OF SID0, PC0 & PC1 ENTER PIM MODE | | 1 | 0 | 0 | 1 | 0 | 1 | 0 | 1 |
| (6) ALL BANKS OF SID0 AND PC0 EXIT FROM PIM MODE | | 1 | 1 | 0 | 1 | 0 | 1 | 1 | 0 |

MEMORY DEVICE PERFORMING CONFIGURABLE MODE SETTING AND METHOD OF OPERATING THE SAME

CROSS-REFERENCE TO RELATED APPLICATION

This application is based on and claims priority under 35 U.S.C. § 119 to Korean Patent Application No. 10-2020-0114045, filed on Sep. 7, 2020, in the Korean Intellectual Property Office, the disclosure of which is incorporated by reference herein in its entirety.

BACKGROUND

Some embodiments of the present disclosure relate to memory devices, and more particularly, to memory devices that perform configurable mode setting and methods of operating the same.

Semiconductor memory devices widely used in high-performance electronic systems are increasing in capacity and speed. In addition to storing data, a method of performing various types of operation processing, such as neural network operations, within a memory device has been proposed. As an example, a memory device may include a plurality of banks and a plurality of processing elements (PEs) that perform operation processing corresponding thereto.

According to the above-described configuration, a memory device may be required to perform a vast amount of arithmetic processing together with normal memory operations, such as data writing and reading. However, such operations may require efficient allocation of resources to process a vast amount of computations, which may result in a decrease in normal memory operation speed.

SUMMARY

Embodiments of the inventive concept may provide a memory device capable of efficiently allocating resources so that computations may be efficiently performed, and a method of operating the same.

A memory device according to some embodiments of the inventive concept may include a memory cell array including a first bank region and a second bank region each including a plurality of banks; an operation logic including one or more first processing elements (PEs) corresponding to the first bank region and one or more second processing elements (PEs) corresponding to the second bank region; a control logic configured to control modes of the first bank region and the second bank region based on externally sourced setting information; a first mode signal generator configured to generate a first mode signal for enabling the first processing elements (PEs), based on the control of the control logic; and a second mode signal generator configured to generate a second mode signal for enabling the second processing elements (PEs), based on the control of the control logic, wherein the first mode signal generator is configured to output the first mode signal to enable the first processing elements (PEs) and the second mode signal generator is configured to output the second mode signal to disable the second processing elements (PEs) responsive to the first bank region being set to an operation mode and the second bank region being set to a normal mode.

BRIEF DESCRIPTION OF THE DRAWINGS

Embodiments of the inventive concept will be more clearly understood from the following detailed description taken in conjunction with the accompanying drawings in which:

FIG. 11 is a table showing an example of an implementation of setting information provided from a memory controller according to example embodiments of the present inventive concept;

DETAILED DESCRIPTION OF THE EMBODIMENTS

Figure 1:
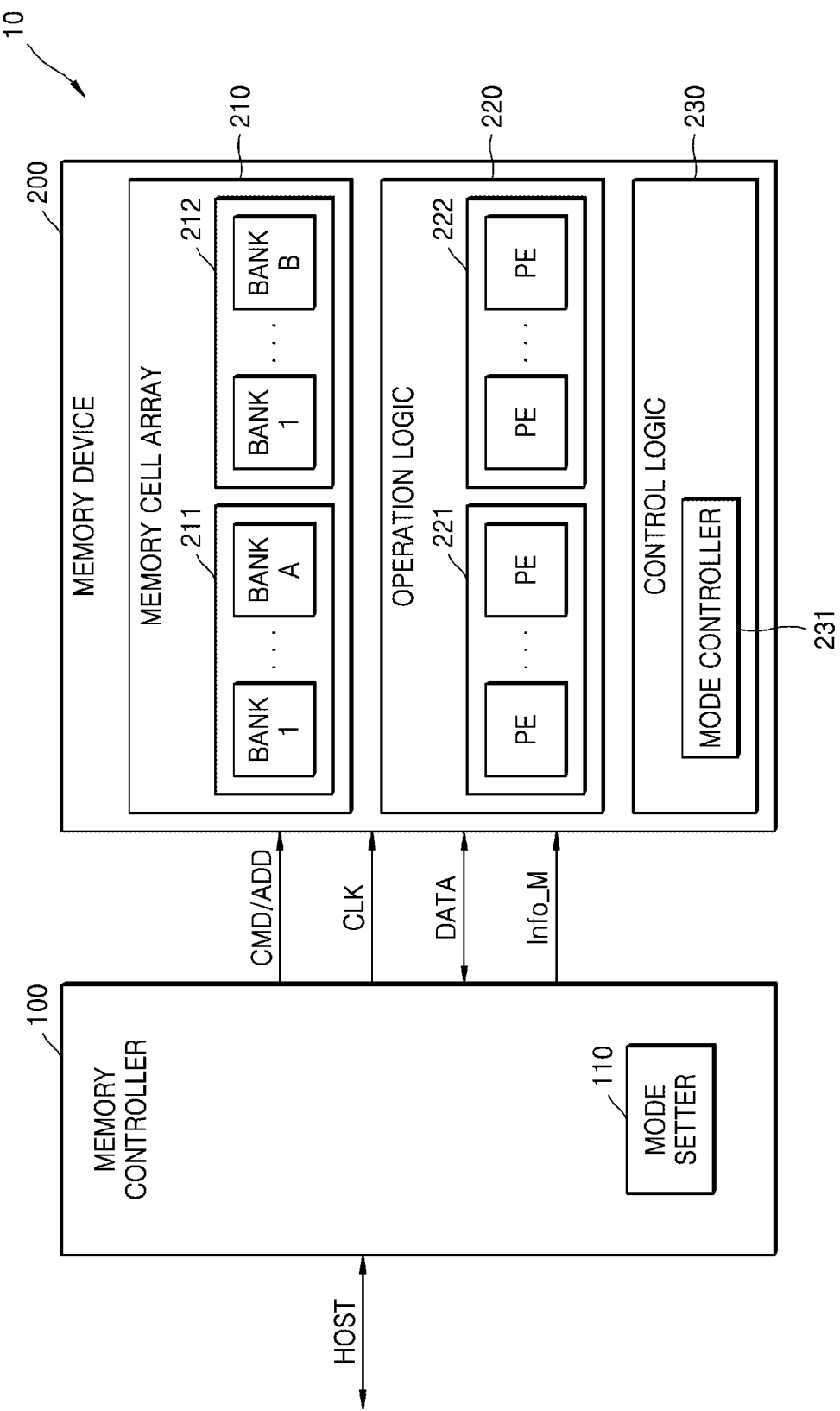
FIG. 1 is a block diagram of a data processing system including a memory device according to an example embodiment of the present inventive concept.

Hereinafter, example embodiments of the inventive concept will be described in detail with reference to the accompanying drawings. The same reference numerals are used for the same elements in the drawings, and redundant descriptions thereof will be omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of a data processing system including a memory device according to an example embodiment of the present inventive concept.

Referring to FIG. 1, a memory system 10 may include a memory controller 100 and a memory device 200. The memory controller 100 and the memory device 200 may exchange various signals by way of an interface circuit (not shown), respectively. For example, the memory controller 100 may provide a clock signal CLK and a command/address CMD/ADD to the memory device 200 to access data DATA stored in the memory device 200.

The memory controller 100 may access the memory device 200 according to or in response to a request from a host HOST, and the memory controller 100 may communicate with the host HOST using various protocols. According to example embodiments, the memory controller 100 may correspond to a host, or the memory controller 100 may correspond to a configuration included in the host HOST. The host HOST and the memory device 200 may constitute a data processing system, and accordingly, the memory system 10 may correspond to a data processing system or be defined as a configuration included in the data processing system.

The memory device 200 may include a memory cell array 210, an operation logic 220, and a control logic 230, and the memory cell array 210 may include a plurality of bank regions. In FIG. 1, first and second bank regions 211 and 212 are illustrated, and each of the first and second bank regions 211 and 212 may include one or more banks. As an example, the first bank region 211 may include A banks (BANK 1 to BANK A), and the second bank region 212 may include B banks (BANK 1 to BANK B). Also, each bank may include a plurality of memory cells.

The operation logic 220 may include a plurality of processing elements PEs respectively corresponding to a plurality of banks. The processing element PE is a device that performs an operation in the memory device 200 and may be referred to as a Processor in Memory (PIM). However, according to embodiments of the inventive concept, the terms described above may be variously defined, and as an example, each of the PIMs may be defined as a module including the above-described processing element PE and other components that control the processing element PE.

According to an implementation example, one processing element PE may be disposed in correspondence with one bank. Alternatively, according to various embodiments, a plurality of processing elements PE may be disposed corresponding to one bank, or one processing element PE may be shared among two or more banks. In addition, each processing element PE may perform operation processing using at least one of data from the host HOST and data read from the memory cell array 210.

According to an example embodiment, the processing element PE included in the operation logic 220 may be classified into a processing element group (PE group). As an example, first and second PE groups 221 and 222 are provided respectively corresponding to the first and second bank regions 211 and 212, and each of the first and second PE groups 221 and 222 may include one or more processing elements PEs.

The control logic 230 may include a command/address decoder (not shown), may perform a decoding operation on the command/address (CMD/ADD), and may control operation processing and memory operation based on the decoding result. According to another example embodiment of the inventive concept, the control logic 230 may include a mode controller 231, and may control a mode setting operation for the first and second bank regions 211 and 212 based on the control of the mode controller 231. The mode controller 231 may be implemented in various forms. As an example, the mode controller 231 may be implemented separately from the command/address decoder, or at least part of the configuration of the mode controller 231 may be included in the command/address decoder.

The memory device 200 may be dynamic random access memory (DRAM), such as Double Data Rate Synchronous Dynamic Random Access Memory (DDR SDRAM), Low Power Double Data Rate (LPDDR) SDRAM, Graphics Double Data Rate (GDDR) SDRAM, and Rambus Dynamic Random Access Memory (RDRAM). However, embodiments of the inventive concept are not limited thereto, and as an example, the memory device 200 may be implemented as a nonvolatile memory, such as a flash memory, magnetic RAM (MRAM), ferroelectric RAM (FeRAM), phase change RAM (PRAM), and resistive RAM (ReRAM).

Also, the memory device 200 may correspond to one semiconductor chip, or may have a configuration corresponding to one channel in a memory device including a plurality of channels having independent interfaces. In other embodiments, the memory device 200 may be a configuration corresponding to a memory module, or when the memory module includes a plurality of memory chips, the memory device 200 of FIG. 1 may correspond to one memory chip mounted on a module board.

Various types of arithmetic processing operations may be performed by the memory device 200, and as an example, in relation to artificial intelligence, at least some of a plurality of operations for a neural network function may be performed by the memory device 200. For example, the host HOST may control the memory device 200 through the memory controller 100 so that at least some of the plurality of operations may be performed by the memory device 200. Hereinafter, an example of a configurable mode setting operation for a plurality of banks will be described according to example embodiments of the inventive concept.

The memory controller 100 may include a mode setter 110, and the mode setter 110 may provide setting information Info_M for setting the mode of the first and second bank regions 211 and 212. As an example, the memory device 200 may control one of the first and second bank regions 211 and 212 to be set to an operation mode and the other to be set a memory mode, based on the setting information Info_M. For example, when the first bank region 211 is set to the operation mode and the second bank region 212 is set to the memory mode, the processing elements PE of the first PE group 221 corresponding to the first bank region 211 may perform arithmetic processing, while the processing elements PE of the second PE group 222 corresponding to the second bank region 212 may be disabled. According to an operation example, processing an operation by the processing elements PE of the first PE group 221 may be performed in parallel with data access to the banks BANK 1 to BANK B of the second bank region 212.

The mode controller 231 may control a mode setting of the first bank region 211 and the second bank region 212 in response to the setting information Info_M. According to one implementation example, the control logic 230 may include a mode register set (MRS), and the setting information Info_M may be received as a code stored in the mode register set, and may be provided to the operation logic 220. The operation logic 220 may further include mode signal generators (not shown) disposed corresponding to the first and second PE groups 221 and 222, and as the mode signal generators provide the mode signal corresponding to the value of the setting information Info_M, the processing elements PE of the first and second PE groups 221 and 222 may be enabled or disabled.

In one embodiment, the memory controller 100 may determine the amount of computations and/or the frequency of data access caused in various ways, such as the type of application being executed, and based on this, the modes of the first and second bank regions 211 and 212 may be changed. For example, the memory controller 100 provides the setting information Info_M having a value that is changed, and the changed setting information Info_M is updated in the control logic 230, and accordingly, the mode of the first and second bank regions 211 and 212 may be changed. The setting information Info_M may be provided to the control logic 230 according to an on-the-fly method.

According to an embodiment of the inventive concept as described above, the memory device 200 may set and change a mode for each bank region, and accordingly, an operation resource and a memory operation resource may be adaptively changed. As an example, the operation speed may be improved by setting a relatively large number of bank regions to the operation mode to perform a large amount of operation processing. When the amount of operation processing is relatively small, the number of bank regions set to the operation mode may be reduced. That is, by adaptively adjusting the resource for operation processing and the resource for memory operation, the speed of the memory operation together with the operation speed may be improved.

The processing element PE may include various types of operators, and as an example, may include operators, such as single instruction multi data (SIMD), arithmetical and logical unit (ALU), and multiply-accumulate (MAC). For example, the processing element PE may perform data operations, such as logical operations including, for example, data invert, data shift, data swap, data compare, AND and XOR, and mathematical operations, such as addition and subtraction.

The memory system 10 or a data processing system including the same may be implemented as a personal computer (PC), a data server, a cloud system, an artificial intelligence server, a network-attached storage (NAS), an Internet of Things (IoT) device, or a portable electronic device. Further, when the data processing system is a portable electronic device, the data processing system may be a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, a wearable device, or the like.

Figure 2:
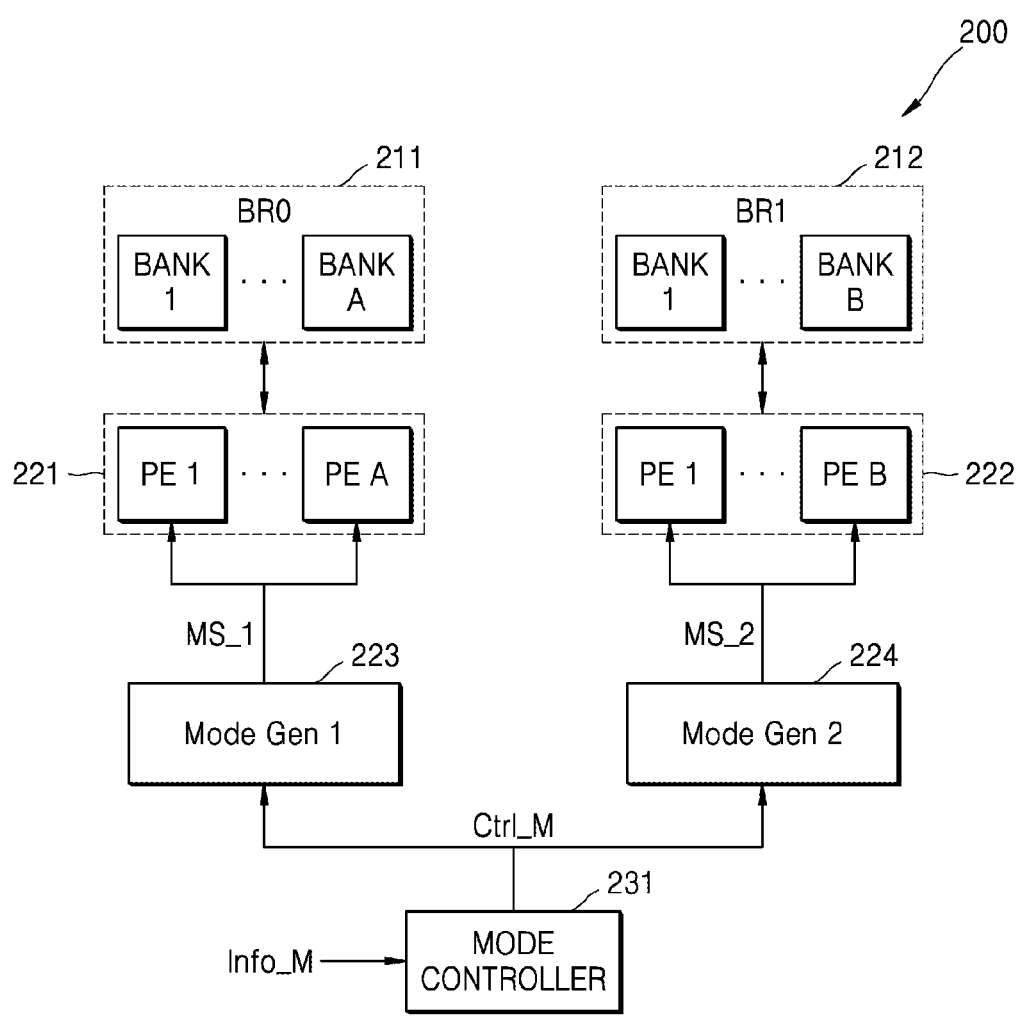
FIG. 2 is a block diagram illustrating an example implementation of the memory device of FIG. 1.

FIG. 2 is a block diagram illustrating an example implementation of the memory device of FIG. 1.

Referring to FIGS. 1 and 2, the memory device 200 may include a first PE group 221 corresponding to the first bank regions BR0 and 211 and including a plurality of first processing elements PE 1 to PE A and a second PE group 222 corresponding to the second bank regions BR1 and 212 and including a plurality of second processing elements PE 1 to PE B, and may further include a first mode signal generator 223 corresponding to the first PE group 221 and a second mode signal generator 224 corresponding to the second PE group 222 In addition, the mode controller 231 may provide the mode control signal Ctrl_M to the first mode signal generator 223 and the second mode signal generator 224 based on the setting information Info_M, respectively.

According to an example embodiment, the mode controller 231 may provide the setting information Info_M as the mode control signal Ctrl_M described above to the first and second mode signal generators 223 and 224, and the first and second mode signal generators 223 and 224 may generate different first and second mode signals MS_1 and MS_2 by processing the mode control signal Ctrl_M, respectively. According to another example embodiment, the mode controller 231 may decode the setting information Info_M to provide different mode control signals Ctrl_M to the first and second mode signal generators 223 and 224. In addition, the first and second mode signal generators 223 and 224 may generate the first and second mode signals MS_1 and MS_2 based on the received mode control signal Ctrl_M.

In an operation example, as the first bank region 211 is set to the operation mode, the first mode signal generator 223 may output the first mode signal MS_1 to enable the first processing elements PE 1 to PE A, while as the second bank region 212 is set to the normal mode, the second mode signal generator 224 may output the second mode signal MS_2 to disable the second processing elements PE 1 to PE B. In addition, rows of a plurality of banks of the first bank region 211 may be active together, and an operation may be performed by at least two first processing elements of the first PE group 221 or may be performed by all of the first processing elements of the first PE group 221. In addition, when an active command for the second bank region 212 is received, a row of one bank selected from among a plurality of banks of the second bank region 212 may be active, and data may be accessed from the activated row.

Figure 3:
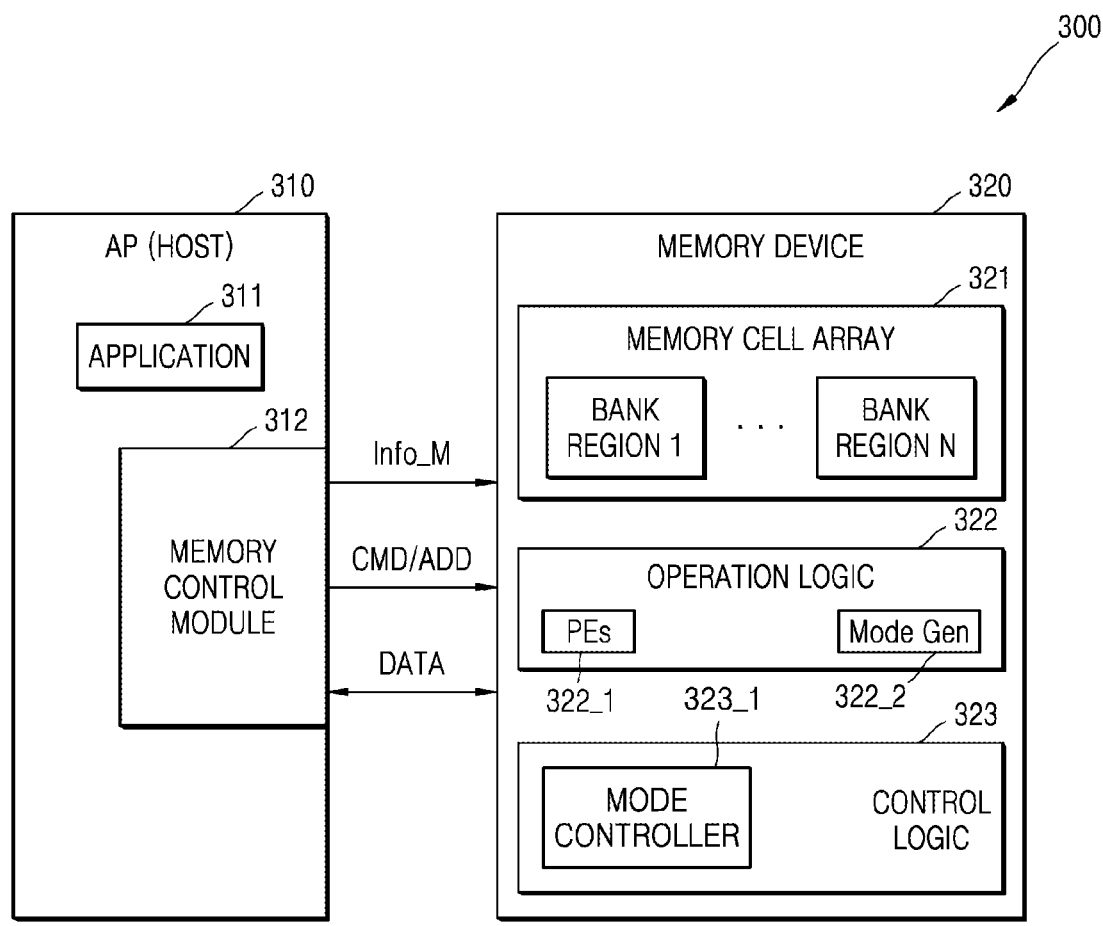
FIG. 3 is a block diagram illustrating a data processing system including a memory device according to an example embodiment of the present inventive concept.

In the embodiment illustrated in FIG. 2, an example in which one processing element PE corresponds to one bank is illustrated, but embodiments of the inventive concept are not limited thereto. As an example, as described above, two or more processing elements PE may correspond to one bank, or one processing element PE may correspond to two or more banks. FIG. 3 is a block diagram illustrating a data processing system including a memory device according to an example embodiment of the present inventive concept. As shown in FIG. 3, a data processing system 300 may include an application processor 310 and a memory device 320, and the application processor 310 may include an application 311 and a memory control module 312. As an example, the memory control module 312 and the memory device 320 may constitute a memory system. The application processor 310 may perform a host function in FIG. 1. In addition, the application processor 310 may be implemented as a System on Chip (SoC) including a system bus (not shown) having various types of standard standards such as an Advanced Microcontroller Bus Architecture (AMBA) protocol.

The memory control module 312 may perform the function of a memory controller in the above-described embodiment, and may control a memory operation or control an operation processing operation by transmitting the command/address CMD/ADD to the memory device 320. Further, according to the above-described embodiments, the memory control module 312 may include a mode setter (not shown) that provides setting information Info_M.

In addition, according to the above-described embodiments, the memory device 300 may include a memory cell array 321, an operation logic 322, and a control logic 323, and the control logic 323 may include a mode controller 323_1. In addition, the memory cell array 321 may include first to Nth bank regions as a plurality of bank regions, and the operation logic 322 may include a plurality of PE groups 322_1 and a plurality of mode signal generators 322_2 respectively corresponding to the bank regions. Also, according to the above-described embodiments, modes of the first to Nth bank regions may be set based on the control of the mode controller 323_1 and the mode signal generators 322_2.

The application 311 may be implemented as a combination of software and/or hardware, and may include programs executed by at least one processor (not shown) in the application processor 310. As the application 311 is executed, a number of operations may be processed by the memory device 320, and based on the setting information Info_M, some bank regions in the memory cell array 321 may be set to an operation mode and other bank regions may be set to a normal mode. As an example, depending on the type of the application 311 being executed, the usage characteristics of the memory device 320, such as the amount of computations and the frequency of memory operations performed by the memory device 320 may vary, and mode setting for the bank regions of the memory cell array 321 may be performed so as to be tailored or optimized for the application 311.

Figure 4:
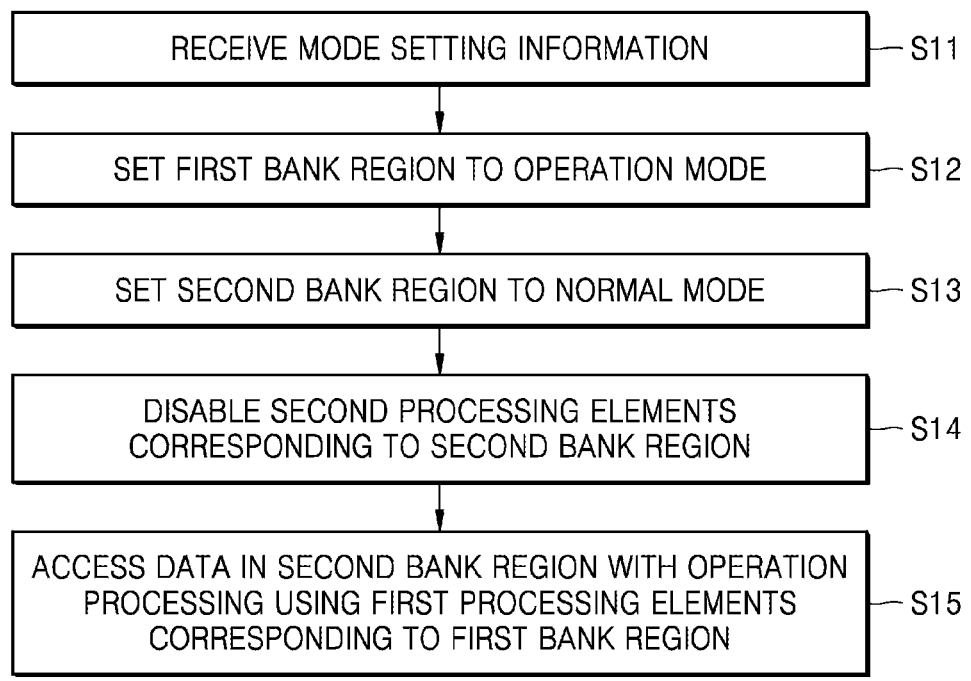
FIGS. 4 and 5 are flowcharts illustrating a method of operating a memory device, according to example embodiments of the present inventive concept.
Figure 5:
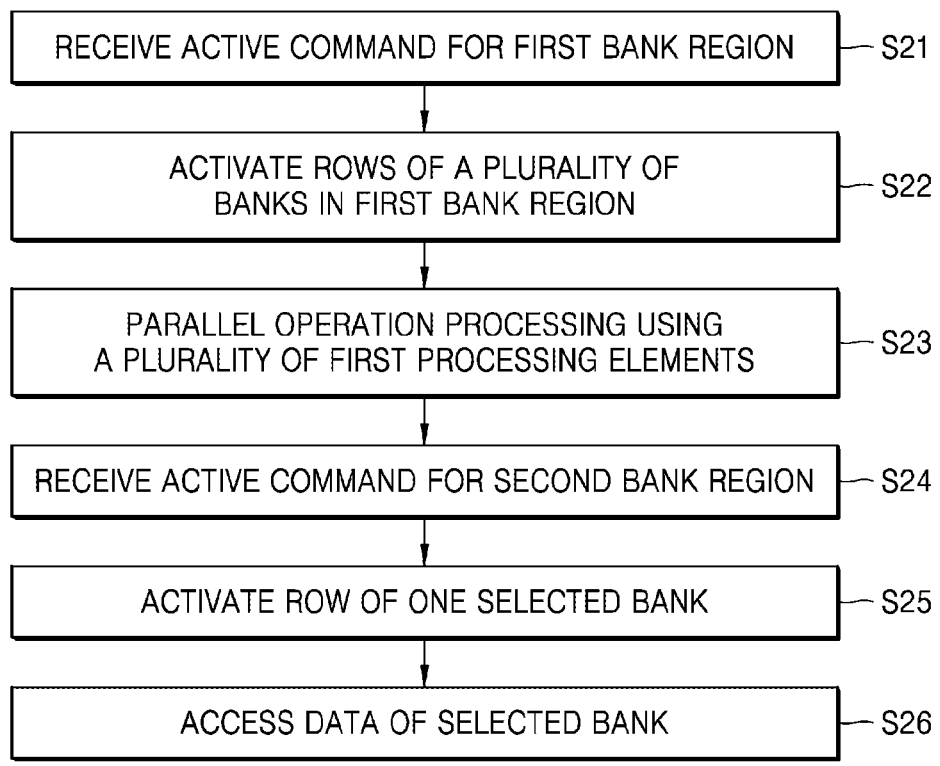

FIGS. 4 and 5 are flowcharts illustrating a method of operating a memory device, according to example embodiments of the present inventive concept.

Referring to FIG. 4, the memory device may include a plurality of bank regions, and a PE group including a plurality of processing elements may be disposed in correspondence to each bank region. As an example, it is assumed that a first PE group corresponding to the first bank region includes a plurality of first processing elements, and a second PE group corresponding to the second bank region includes a plurality of second processing elements.

The memory device may receive various commands from a memory controller (or host), and may perform an operation process or a memory operation in response to the commands. Also, at block S11, the memory device may receive setting information (or mode setting information) from the memory controller, and may perform a control operation for setting the modes of the plurality of bank regions based on the received setting information. As an example, both the first and second bank regions may be set to an operation mode, or both may be set to a normal mode, depending on the value of the setting information. In an example embodiment, the setting information may be stored in a memory device, and based on the stored setting information, a first bank region may be set to an operation mode at block S12, and a second bank region may be set to a normal mode at block S13.

The memory device may generate a first mode signal for the first bank region and may generate a second mode signal for the second bank region based on the setting information. At block S14, the second mode signal may include information for disabling the second processing elements of the second PE group, and accordingly, operation processing may not be performed by the second PE group. Also, the first mode signal may include information for enabling the first processing elements of the first PE group.

Thereafter, operation processing and memory operations may be performed according to various commands/addresses from the memory controller. As an example, at block S15, operation processing using first processing elements may be performed for the first bank region based on control of the control logic, and data access operations for the banks of the second bank region may be performed. Further, the above-described operation processing and data access may be performed together or simultaneously.

FIG. 5 is a flowchart that illustrates an operation example in which the first bank region is set to the operation mode and the second bank region is set to the normal mode.

Referring to FIG. 5, the memory controller may provide various commands and addresses for operation processing and memory operation of a memory device, and may provide active commands for operation processing in a first bank region set to the operation mode. The memory device may receive an active command for the first bank region at block S21, and activate rows of a plurality of banks in the first bank region at block S22.

The first processing elements of the first PE group may perform operation processing using data read from corresponding banks, or may store operation processing results in corresponding banks. As an example, at block S23, parallel operation processing is performed by a plurality of first processing elements using data read from activated rows in the first bank region, or the result of the operation processing performed by the plurality of first processing elements may be stored in activated rows of the first bank region.

The memory controller may provide an active command for a memory operation in the second bank region set to the normal mode, and the memory device may receive the active command for the second bank region at block S24. The memory device may activate a row of one selected bank among a plurality of banks of the second bank region based on an address received from the memory controller at block S25, and may access data of the selected bank at block S26.

Figure 6:
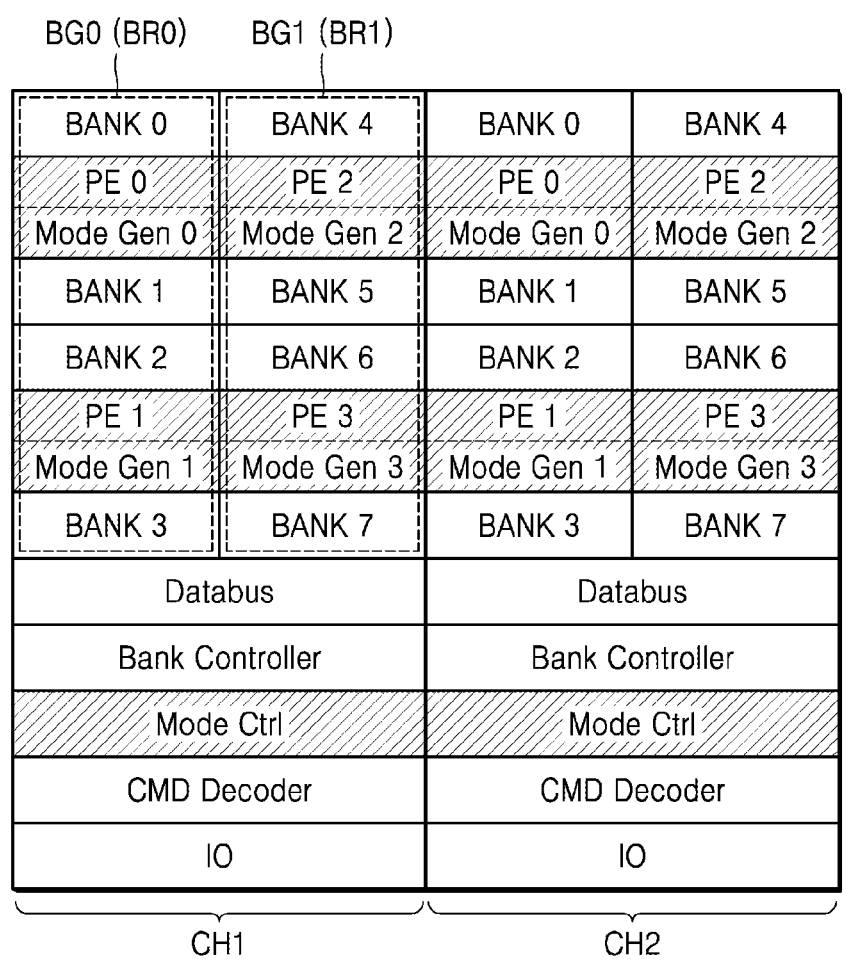
FIG. 6 is a diagram illustrating an example of setting a bank region in a memory device having a plurality of channels according to example embodiments of the present inventive concept.

FIG. 6 is a diagram illustrating an example of setting a bank region in a memory device having a plurality of channels according to some embodiments of the inventive concept.

As shown in FIG. 6, the memory device may include a plurality of channels (e.g., first and second channels CH1 and CH2), and the first and second channels CH1 and CH2 may communicate with an external memory controller (or host) according to an interface independent from each other. As an example, the first and second channels CH1 and CH2 may receive a command/address and data through a bus disposed independently of each other, and the first and second channels CH1 and CH2 may independently receive setting information in the above-described embodiment from the memory controller.

Referring to the first channel CH1, the first channel CH1 may include a plurality of banks (e.g., first to eighth banks BANK 0 to BANK 7), and the first to eighth banks BANK 0 to BANK 7 may be classified into at least two bank groups. FIG. 6 illustrates an example in which a first bank group BG0 includes first to fourth banks BANK 0 to BANK 3 and a second bank group BG1 includes fifth to eighth banks BANK 4 to BANK 7. In addition, FIG. 6 shows an example in which one processing element PE corresponds to two banks, and accordingly, first to fourth processing elements PE0 to PE3 may be provided respectively corresponding to the first to eighth banks BANK 0 to BANK 7.

In addition, each of the first and second channels CH1 and CH2 may include an input/output line IO configured to communicate with the memory controller, a data bus as a path for transmitting accessed data, a bank controller for accessing the data of the banks, and a command decoder for decoding a command/address from the memory controller. According to an implementation example, the bank controller is shown to be commonly disposed in a plurality of banks, but the bank controller may be disposed corresponding to each bank, and may perform various controls related to operation processing and/or memory operations, such as an active operation on rows included in the bank, a precharge operation, and a column selection operation for data access.

According to an example embodiment of the inventive concept, the above-described bank region may correspond to a bank group or may include two or more bank groups. For example, the first bank group BG0 may correspond to the first bank region BR0, and the second bank group BG1 may correspond to the second bank region BR1. The bank groups may be classified in various ways, for example, lines related to transmission of various signals may be arranged based on the bank group, and various parameters related to memory operation may be set. For example, data may be delivered through a local IO arranged for each bank and a bank group IO arranged for each bank group, and data of banks included in the same bank group may be delivered through the same bank group IO. In addition, various parameter values may be set through a design based on a bank group. As an example, in relation to a read interval between a plurality of banks, the read interval between banks in the same bank group may be set relatively longer than the read interval between banks between different groups.

Further, according to an example embodiment of the inventive concept, each of the first and second channels CH1 and CH2 may further include a mode controller Mode Ctrl that receives setting information (not shown) from the memory controller. In addition, as each bank group is set as a bank region, a mode signal generator may be disposed corresponding to each bank group. In FIG. 6, an example in which a first mode signal generator Mode Gen 1 corresponds to the first bank group BG0, and a second mode signal generator Mode Gen 2 corresponds to the second bank group BG1 is shown.

According to the above-described configurations, the modes of the first bank group BG0 and the second bank group BG1 may be set based on the control of the mode controller Mode Ctrl, and any one of the first bank group BG0 and the second bank group BG1 may be selectively set to the operation mode. Alternatively, both the first bank group BG0 and the second bank group BG1 may be set to the operation mode or the normal mode based on the control of the mode controller Mode Ctrl. In addition, when the operation processing is performed on all banks of the memory device in a batch, it may not be possible to use the bus for memory operation. However, according to the above-described embodiment of the inventive concept, a bus to be used for a memory operation may be secured through mode setting and mode switching for each bank group, and the performance of a memory device may be efficiently utilized.

Figure 7:
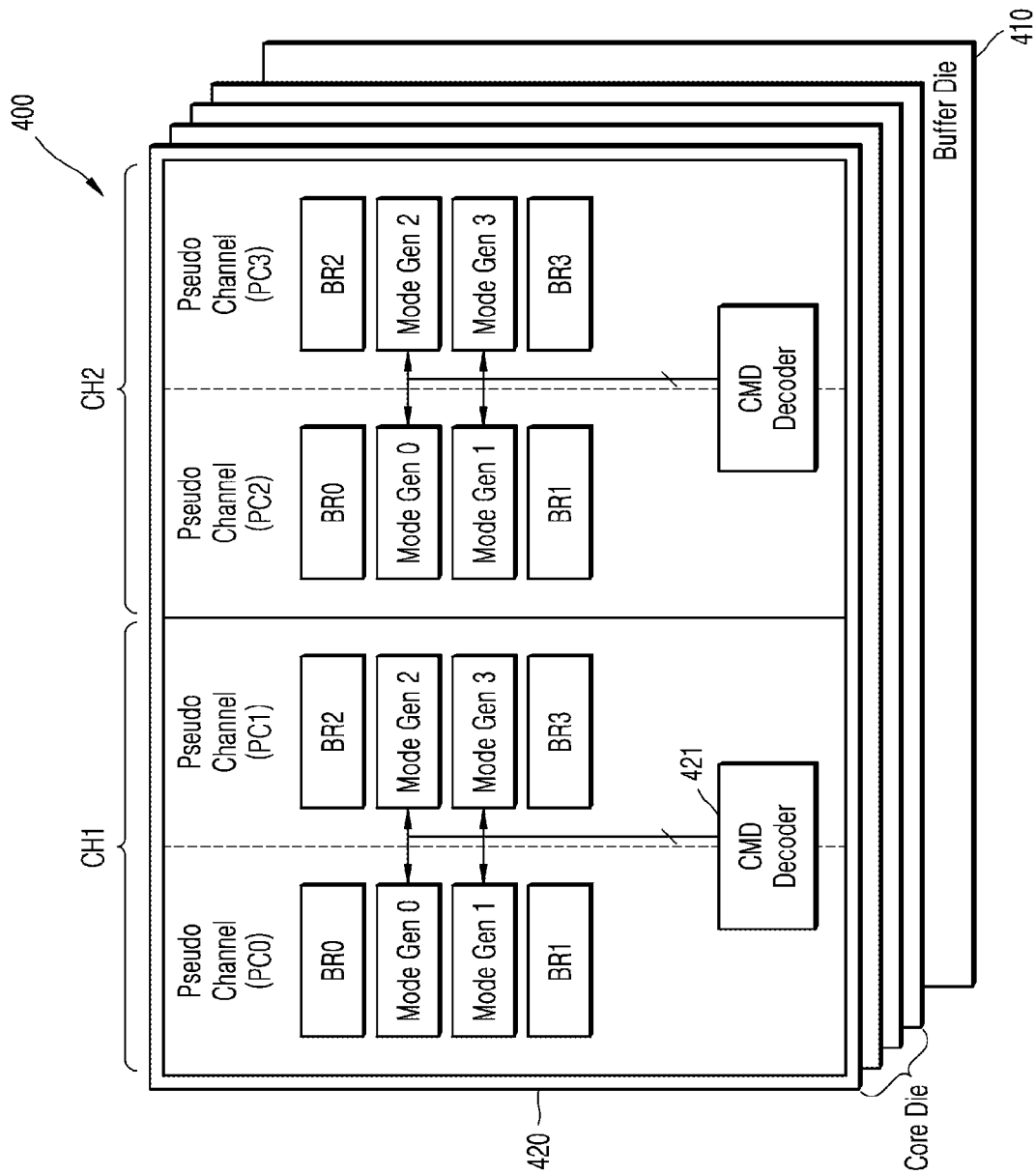
FIG. 7 is a block diagram illustrating an example in which a memory device of an example embodiment of the present inventive concept includes a high bandwidth memory (HBM).

FIG. 7 is a block diagram illustrating an example in which a memory device of an example embodiment of the present disclosure includes a high bandwidth memory (HBM).

An HBM 400 may have an increased bandwidth by including a plurality of channels having independent interfaces from each other. Referring to FIG. 7, the HBM 400 may include a plurality of dies, and as an example, may include a buffer die 410 (or a logic die) and one or more core dies stacked thereon. In the example of FIG. 7, an example in which four core dies are provided in the HBM 400 is illustrated, but the number of core dies may vary in different embodiments of the inventive concept. The configuration of FIG. 7 will be described with reference to a first core die 420 among the core dies as follows.

As one or more channels, in the example of FIG. 7, a case in which the first core die 420 includes first and second channels CH1 and CH2 is illustrated. The buffer die 410 may include an interface circuit (not shown) that is configured to communicate with a memory controller (or host), and may receive commands/addresses and data from the memory controller through the buffer die 410. In addition, according to an example embodiment of the inventive concept, each of the first and second channels CH1 and CH2 may include a command decoder 421. Although not shown in FIG. 7, a mode controller for a mode control operation according to the above-described embodiments may be provided in each of the first and second channels CH1 and CH2.

An example of an implementation in which each channel of the HBM 400 includes at least two pseudo channels is shown in FIG. 7. As an example, the first channel CH1 may include first and second pseudo channels PC0 and PC1, and while the data buses are implemented separately from each other corresponding to the first and second pseudo channels PC0 and PC1, the first and second pseudo-channels PC0 and PC1 may share the command decoder 421. In addition, according to various embodiments, some of the various components related to the mode setting are implemented to be shared with the first and second pseudo channels PC0 and PC1, and others may be implemented separately for each pseudo channel. That is, the first and second pseudo channels PC0 and PC1 may interface with the memory controller through separate data buses, and may interface with the memory controller through a common command/address bus.

According to an example embodiment of the inventive concept, each of the first and second pseudo channels PC0 and PC1 may include a plurality of bank regions. As an example, the first pseudo channel PC0 may include a first bank region BR0 and a second bank region BR1, and the second pseudo channel PC1 may include a third bank region BR2 and a fourth bank region BR3. In addition, first to fourth mode signal generators Mode Gen0 to Mode Gen3 may be disposed respectively corresponding to the first to fourth bank regions BR0 to BR3, and each of the first to fourth mode signal generators Mode Gen0 to Mode Gen3 may control enabling of processing elements (or PE group, not shown) disposed for a corresponding bank region.

According to an operation example, modes of a plurality of bank regions may be variably set within one channel or one pseudo channel. Taking the first channel CH1 as an example, some of the first to fourth bank regions BR0 to BR3 may be set to an operation mode, and others may be set to a normal mode. Alternatively, taking the first pseudo channel PC0 as an example, one of the first and second bank regions BR0 and BR1 may be set to an operation mode, and the other may be set to a normal mode. In addition, according to various embodiments, the mode of the bank regions may be set in units of pseudo-channels. As an example, a memory device may be implemented, such that bank regions of one of the first pseudo channel PC0 and the second pseudo channel PC1 are set to the operation mode, while the bank regions of the other pseudo channel are set to the normal mode.

According to the example embodiment of the inventive concept, a plurality of processing elements for operation processing may be arranged respectively corresponding to the banks of the core dies, and by classifying the banks into a plurality of bank regions, it may be possible to provide a variable mode setting for each bank area. Therefore, not only may a large amount of operations in the memory device be processed quickly, but also operation operations may be tailored or optimized according to various types of applications being executed.

Figure 8:
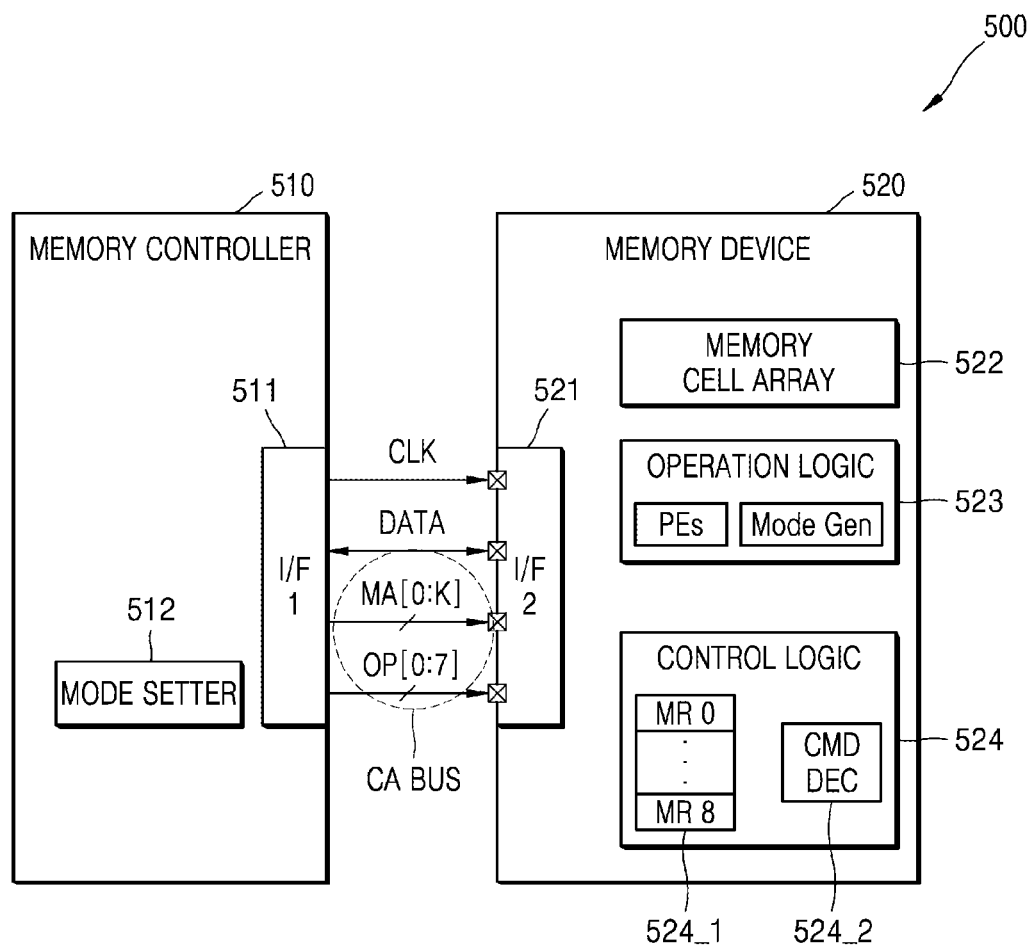
FIG. 8 is a block diagram illustrating a memory system according to an example embodiment of the present inventive concept.

FIG. 8 is a block diagram illustrating a memory system according to an example embodiment of the present inventive concept. FIG. 8 illustrates an example in which setting information of the above-described embodiments is stored in a mode register set (MRS) in a memory device.

Referring to FIG. 8, a memory system 500 may include a memory controller 510 and a memory device 520, and the memory controller 510 may include a first interface circuit 511 and a mode setter 512. In addition, the memory device 520 may include a second interface circuit 521, a memory cell array 522, an operation logic 523, and a control logic 524. Although a detailed illustration is omitted for convenience of description, the memory cell array 522 may include a plurality of bank regions, and the operation logic 523 may include a plurality of PE groups respectively corresponding to the bank regions and mode signal generators that control enablement of the plurality of PE groups.

The first interface circuit 511 and the second interface circuit 521 may transmit and receive various signals through various buses. As an example, the second interface circuit 521 may receive a clock signal CLK through a clock pin, transmit and receive data DATA through a data pin, and receive a command/address through command/address pins. As an example, the setting information in the above-described embodiments may be provided to the second interface circuit 521 through a command/address bus CA BUS.

The control logic 524 may include a mode register set 524_1 and a command decoder 524_2, and at least some of the mode register set 524_1 and the command decoder 524_2 may constitute a mode controller in the above-described embodiments. The mode register set 524_1 may include a plurality of mode registers indicated by the mode register MR address MA [0:K]. In addition, the setting information in the above-described embodiments may be stored in one or more mode registers selected from among a plurality of mode registers. As an example, the setting information may be provided from the memory controller 510 as an OP code OP [0:7]. In FIG. 8, first to ninth mode registers MR 0 to MR 8 are illustrated as a plurality of mode registers, and an 8-bit OP code OP[0:7] is illustrated, but embodiments of the inventive concept are not limited thereto and may be implemented in various ways.

Taking the HBM MRS specification as an example, some of the plurality of mode registers may store various types of information related to the HBM operation environment setting, and may also provide a reserved future usage (RFU) field. The setting information (or the OP code (OP [0:7])) may be stored in the RFU field of one or more mode registers. The memory controller 510 may provide an MR address (MA [0:K]) together with an MRS command requesting storage of the setting information, and the setting information may be stored in a region indicated by the MR address MA [0:K] based on the control of the command decoder 524_2.

Figure 9:
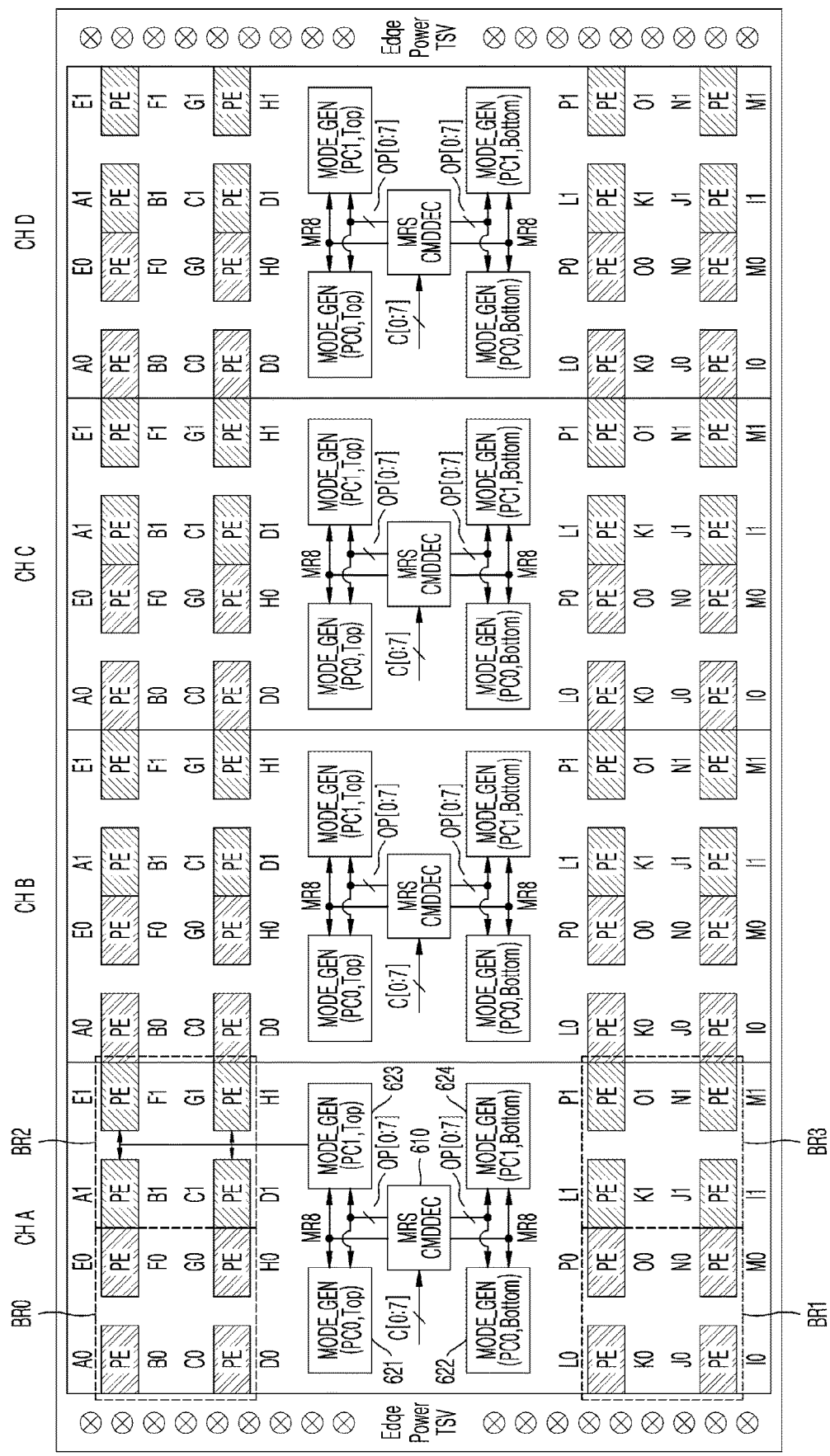
FIG. 9 is a block diagram illustrating a specific implementation example of a memory device according to an embodiment of the present inventive concept.

FIG. 9 is a block diagram illustrating a specific implementation example of a memory device according to an embodiment of the present disclosure. As an example, a memory device 900 of FIG. 9 may include a plurality of channels CH A to CH D, and according to the embodiment of the inventive concept applied to each channel, a plurality of bank regions are provided in each channel, and an operation mode thereof may be set for each bank region. According to an example embodiment, the memory device 900 of FIG. 9 may correspond to any core die of HBM, and a plurality of power through silicon vias (TSVs) for transmitting power may be disposed in an outer region of the memory device 900.

Referring to one channel (e.g., channel A (CH A)) of the memory device 600 of FIG. 9, the channel A (CH A) may include first to fourth bank regions BR0 to BR3 as a plurality of bank regions, and one or more processing elements (e.g., ALU) may be disposed corresponding to each bank region. In FIG. 9, an example in which the first bank region BR0 includes eight banks A0 to H0 and one processing element is disposed corresponding to two banks is illustrated. Also, in an example embodiment, one bank region may correspond to one bank group.

The channel A (CH A) may include an MRS and a command decoder 610, and first to fourth mode signal generators 621 to 624 may correspond to the first to fourth bank regions BR0 to BR3. The MRS and command decoder 610 may receive a column signal C [0:7] from an external memory controller as setting information OP [0:7] and store the column signal C[0:7] in a mode register (e.g., MR 8) in the MRS. In addition, to set the mode for the first to fourth bank regions BR0 to BR3 based on the information stored in MR 8, setting information OP [0:7] stored in the mode register MR 8 together with information indicating the mode register MR 8 may be provided to the first to fourth mode signal generators 621 to 624, and each of the first to fourth mode signal generators 621 to 624 may generate a mode signal based on the received setting information OP [0:7]. According to an implementation example, the first to fourth mode signal generators 621 to 624 may output a mode signal for enabling a respectively corresponding PE group when setting information OP [0:7] having different values is received. As the third mode signal generator 623 outputs a logic high mode signal, an example in which the third bank region BR2 is set to an operation mode is illustrated in FIG. 9.

The memory device 600 illustrated in FIG. 9 may be an HBM, and each channel may include at least two pseudo channels. According to an implementation example, the first and second bank regions BR0 and BR1 may be included in the first pseudo channel PC0, and the third and fourth bank regions BR2 and BR3 may be included in the second pseudo channel PC1. In addition, each channel may be classified into at least two regions indicated by a predetermined address (e.g., BA3 information) according to a location where the bank is disposed. As an example, the first and third bank regions BR0 and BR2 may be included in the top region, and the second and fourth bank regions BR1 and BR3 may be included in the bottom region.

Figure 10:
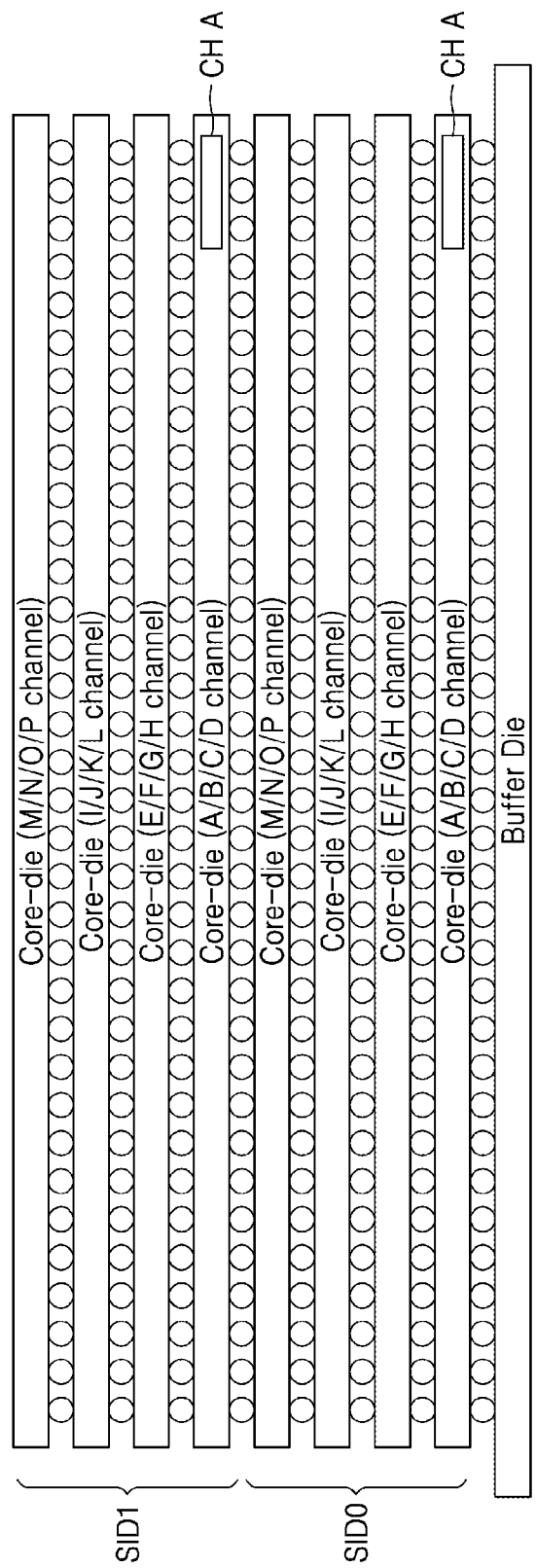
FIG. 10 is a diagram illustrating an example in which a plurality of core dies are classified as ID information according to example embodiments of the present inventive concept.

FIG. 10 is a diagram illustrating an example in which a plurality of core dies are classified as a stack ID SID. As shown in FIG. 10, the HBM may include a plurality of (e.g., 8) core dies, and the core dies may include a first die region having a first ID SID0 and a second die region having a second ID SID1.

According to an implementation example, one channel may include banks of at least two core dies having different IDs. As an example, one or more banks of the first core die CD1 and one or more banks of the fifth core die CD5 may constitute the channel A (CH A), and accordingly, at least two core dies may be configured to communicate with the memory controller through a common interface. Further, according to an example embodiment of the inventive concept, for the first and fifth core dies CD1 and CD5 constituting the same channel A (CH A), when setting the mode of the bank region, bank regions of the first and fifth core dies CD1 and CD5 may be selected based on the stack ID SID. According to the configuration example illustrated in FIG. 10, a memory device may be implemented to include a plurality of ranks (RANKs).

FIG. 11 is a table showing an example of an implementation of setting information provided from a memory controller. In FIG. 11, an example in which mode setting is performed in various ways according to a value of setting information OP [0:7] is illustrated, and an operation example (or mode setting example) in channel A (CH A) is described.

Referring to FIGS. 9 to 11, a location of the mode register in which the setting information OP [0:7] will be stored may be determined according to the MR address MA [0:4], and the modes of the first to fourth bank regions BR0 to BR3 may be variably set according to the value of the setting information OP [0:7]. As an example, the entry of the operation mode or the exit from the operation mode may be determined based on the information of the OP codes OP1 and OP2, and also a core die may be selected according to the stack ID SID based on the information of the OP codes OP2 and OP3. In addition, when each channel includes a plurality of pseudo-channels, a pseudo-channel to enter the operation mode may be selected based on information of the OP codes OP4 and OP5. In addition, when the same channel (or the same pseudo-channel) is logically or physically classified into a plurality of regions (e.g., the top region and the bottom region), a region to enter the operation mode may be selected based on information of the OP codes OP6 and OP7.

According to an implementation example illustrated in FIG. 11, when the setting information OP [0:7] has a value of "0" as in case (1) of FIG. 11, the memory device 900 may be set to a normal mode corresponding to the default mode, and accordingly, all bank regions in the memory device 900 may be set to the normal mode.

When the setting information OP [0:7] has a value as in case (2) of FIG. 11, the first pseudo channel PC0 of the core die having the first ID SID0 may be selected according to the OP codes OP2 to OP5, and all banks of the first pseudo channel PC0 may be selected according to the OP codes OP6 and OP7. In addition, all banks of the first pseudo channel PC0 of SID0 may enter the operation mode according to the OP codes OP0 and OP1.

When the setting information OP [0:7] has a value as in case (3) of FIG. 11, the first pseudo channel PC0 of SID0 and SID1 may be selected according to the OP codes OP2 to OP5, and all banks of the first pseudo channel PC0 may be selected according to the OP codes OP6 and OP7. In addition, all banks of the first pseudo channel PC0 of SID0 and SID1 may enter the operation mode according to the OP codes OP0 and OP1.

When the setting information (OP [0:7]) has a value as in case (4) of FIG. 11, the first pseudo channel PC0 of SID0 may be selected according to the OP codes OP2 to OP5, and banks (e.g., L0 to M0) of the bottom region of the first pseudo channel PC0 of SID0 may be selected according to the OP codes OP6 and OP7. In addition, banks in the bottom region of the first pseudo channel PC0 of SID0 may enter the operation mode according to the OP codes OP0 and OP1.

When the setting information OP [0:7] has a value as in case (5) of FIG. 11, based on the above operation, banks (e.g., L0 to M0, L1 to M1) may enter the operation mode, and when the setting information OP [0:7] has a value as in case (6) of FIG. 11, all the banks of the first pseudo channel PC0 of SID0 may exit from the operation mode.

The mode control according to the setting information OP [0:7] shown in FIG. 11 as described above is only an example, and by varying the code values of the setting information OP [0:7], the modes of the bank regions may be set according to various methods.

Figure 12:
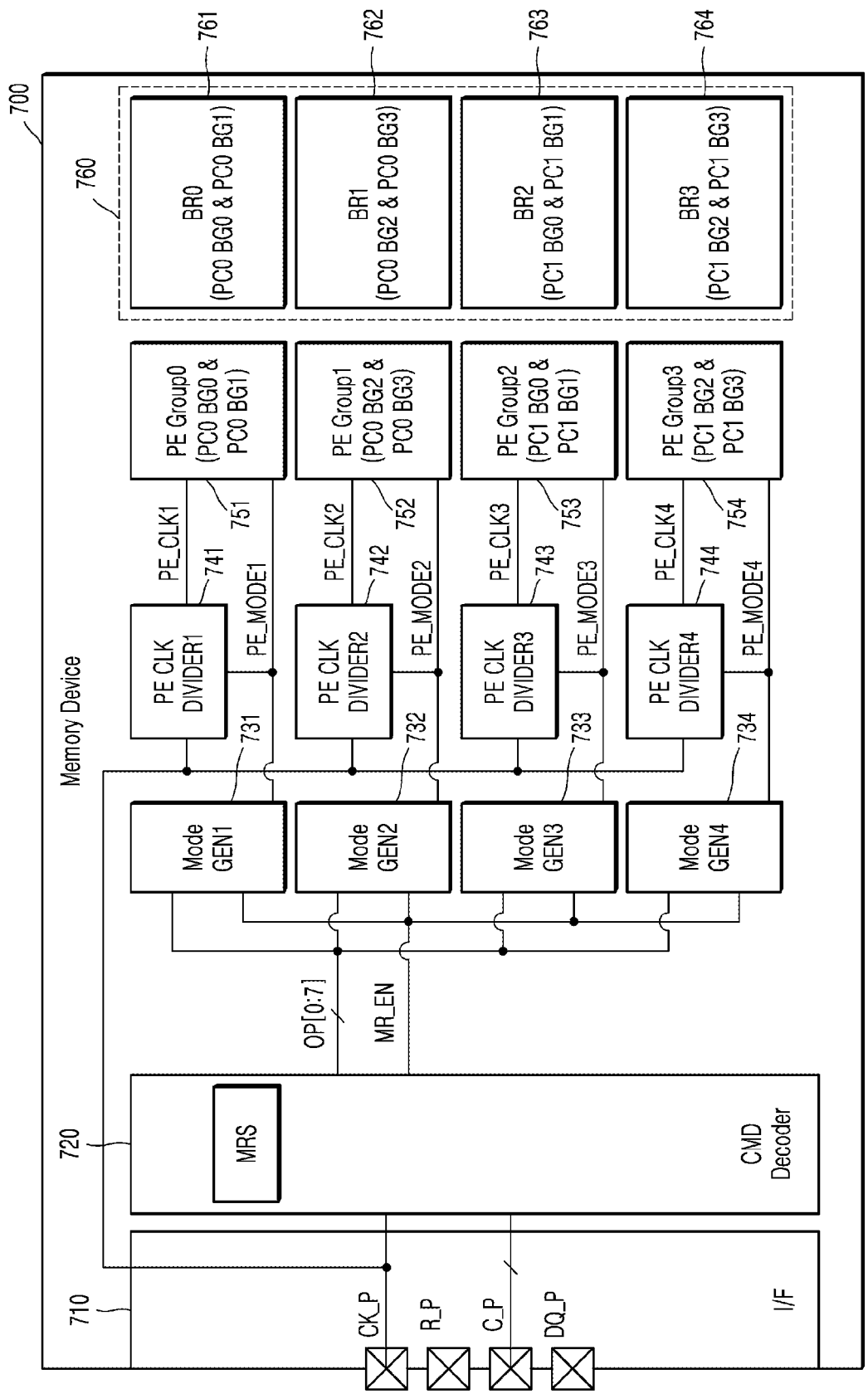
FIGS. 12 to 14 are diagrams illustrating various operation examples of a memory device according to an example embodiment of the present inventive concept.
Figure 13:
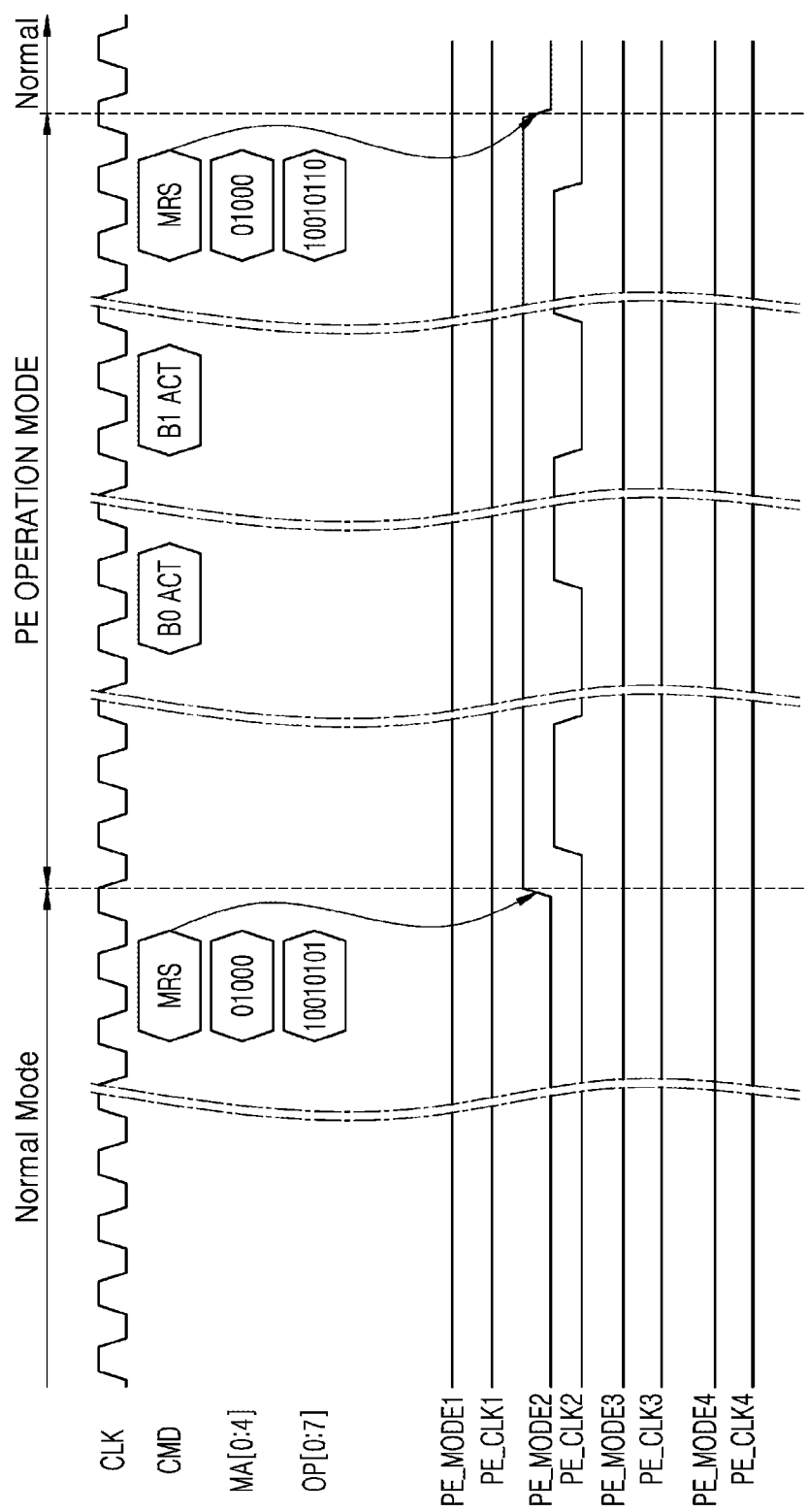
Figure 14:
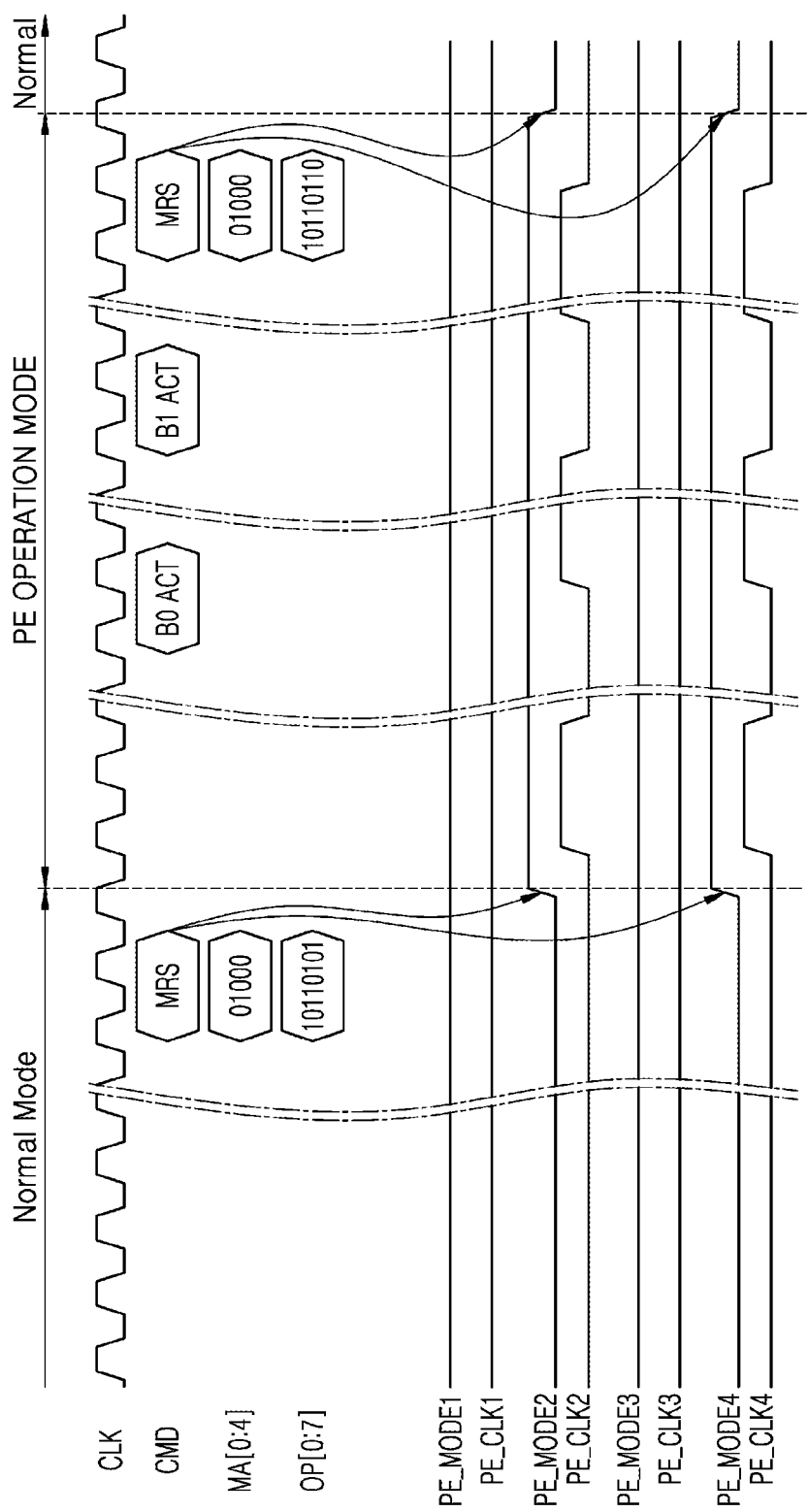

FIGS. 12 to 14 are diagrams illustrating various operation examples of a memory device according to an example embodiment of the present inventive concept.

Referring to FIG. 12, a memory device 700 may include an interface circuit 710, a command decoder 720, and a memory cell array 760. The memory cell array 760 may include a plurality of bank regions (for example, first to fourth bank regions 761 to 764). According to an implementation example, an example in which the first bank region 761 includes first and second bank groups BG0 and BG1 of the first pseudo channel PC0, and the second bank region 762 includes third and fourth bank groups BG2 and BG3 of the first pseudo channel PC0 is illustrated.

According to the above-described embodiments, a PE group including one or more processing elements may be disposed in correspondence to each bank region, and a clock generator may be arranged corresponding to each PE group to provide a driving clock signal to the processing elements within the PE group. In addition, a mode signal generator may correspond to each bank region. As shown in FIG. 12, an example in which the first to fourth mode signal generators 731 to 734, first to fourth clock generators 741 to 744, and first to fourth PE groups 751 to 754 are provided corresponding to the first to fourth bank regions 761 to 764 is illustrated.

In FIG. 12, the MRS for storing setting information is shown to be provided in the command decoder 720, but it may be shown that the MRS is disposed outside the command decoder 720, and a clock divider for generating driving clock signals PE_CLK1 to PE_CLK4 of processing elements is illustrated as the first to fourth clock generators 741 to 744.

The interface circuit 710 may communicate with an external memory controller (not shown) through various types of pins, and may transmit/receive a clock signal and data through a clock pin CK_P and a data pin DQ_P. In addition, a row pin R_P for receiving a row signal and a column pin C_P for receiving a column signal may be provided in relation to the command/address. In an example embodiment, the setting information may be received through the column pin C_P. In addition, the clock signal received through the clock pin CK_P is provided to the first to fourth clock generators 741 to 744 and may be used to generate the driving clock signals PE_CLK1 to PE_CLK4.

According to an example embodiment, the processing elements may be enabled or disabled by providing a driving clock signal to a PE group corresponding to the bank region set to the operation mode and blocking the driving clock signal from being provided to the PE group corresponding to the bank region set to the normal mode. As an example of operation, information MR_EN indicating a mode register used for setting and setting information OP [0:7] may be provided to the first to fourth mode signal generators 731 to 734. The first to fourth mode signal generators 731 to 734 may process the received information to generate first to fourth mode signals PE_MODE1 to PE_MODE4, and to provide the generated first to fourth mode signals PE_MODE1 to PE_MODE4 to the first to fourth clock generators 741 to 744 and the first to fourth PE groups 751 to 754. Assuming that the first bank region 761 is set to the operation mode, the first clock generator 741 may activate the first driving clock signal PE_CLK1 in response to the first mode signal PE_MODE1; the remaining driving clock signals PE_CLK2 to PE_CLK4 may be deactivated.

FIG. 13 is a waveform diagram illustrating an example in which the memory device operates according to the case (4) of FIG. 11. The memory device 700 of FIG. 12 corresponds to SID0. The first and second bank groups BG0 and BG1 of the first bank region 761 may be included in the top region of the first pseudo channel PC0, and the third and fourth bank groups BG2 and BG3 of the second bank region 762 may be included in the bottom region of the first pseudo channel PC0. As an example, the first bank group BG0 may include the banks A0, C0, E0, and F0 of FIG. 11, and the second bank group BG1 may include banks C0, D0, G0, and H0 of FIG. 11.

The memory device 700 may operate in a normal mode, and may receive an MR address (MA [0:4]) indicating a location of a mode register and a setting information OP [0:7], together with an MRS command for MRS setting from the memory controller. The setting information OP [0:7] may include information according to the case (4) of FIG. 11. As the second bank region 762 corresponding to the bottom region of the first pseudo channel PC0 is set to the operation mode, the second mode signal PE_MODE2 may be activated and the second driving clock signal PE_CLK2 may be activated to be provided to the second PE group 752. In addition, at least one active command (B0 CMD, B1 CMD) may be provided for operation processing during the operation mode, and a plurality of banks may be activated together.

Thereafter, setting information OP [0:7] may be received for a mode change, and the second bank region 762 may be changed to a normal mode according to the setting information OP [0:7]. Accordingly, the second mode signal PE_MODE2 may be deactivated and the second driving clock signal PE_CLK2 may be deactivated.

FIG. 14 is a waveform diagram illustrating an example in which the memory device operates according to the case (5) of FIG. 11 described above. Referring to FIG. 14, as the mode is set according to the case (5) of FIG. 11, the second and fourth bank regions 762 and 764 corresponding to the bottom regions of the first and second pseudo channels PC0 and PC1 may be set as an operation mode. As an example, the second mode signal PE_MODE2 and the fourth mode signal PE_MODE4 may be activated, and the second driving clock signal PE_CLK2 and the fourth driving clock signal PE_CLK4 may be activated and provided to the second PE group 752 and the fourth PE group 754, respectively. In addition, during the operation mode, at least one active command (B0 CMD, B1 CMD) may be provided for operation processing, and after that, as the setting information OP [0:7] is changed, the second and fourth mode signals PE_MODE2 and PE_MODE4 and the second and fourth driving clocks PE_CLK2 and PE_CLK4 may be deactivated.

Figure 15:
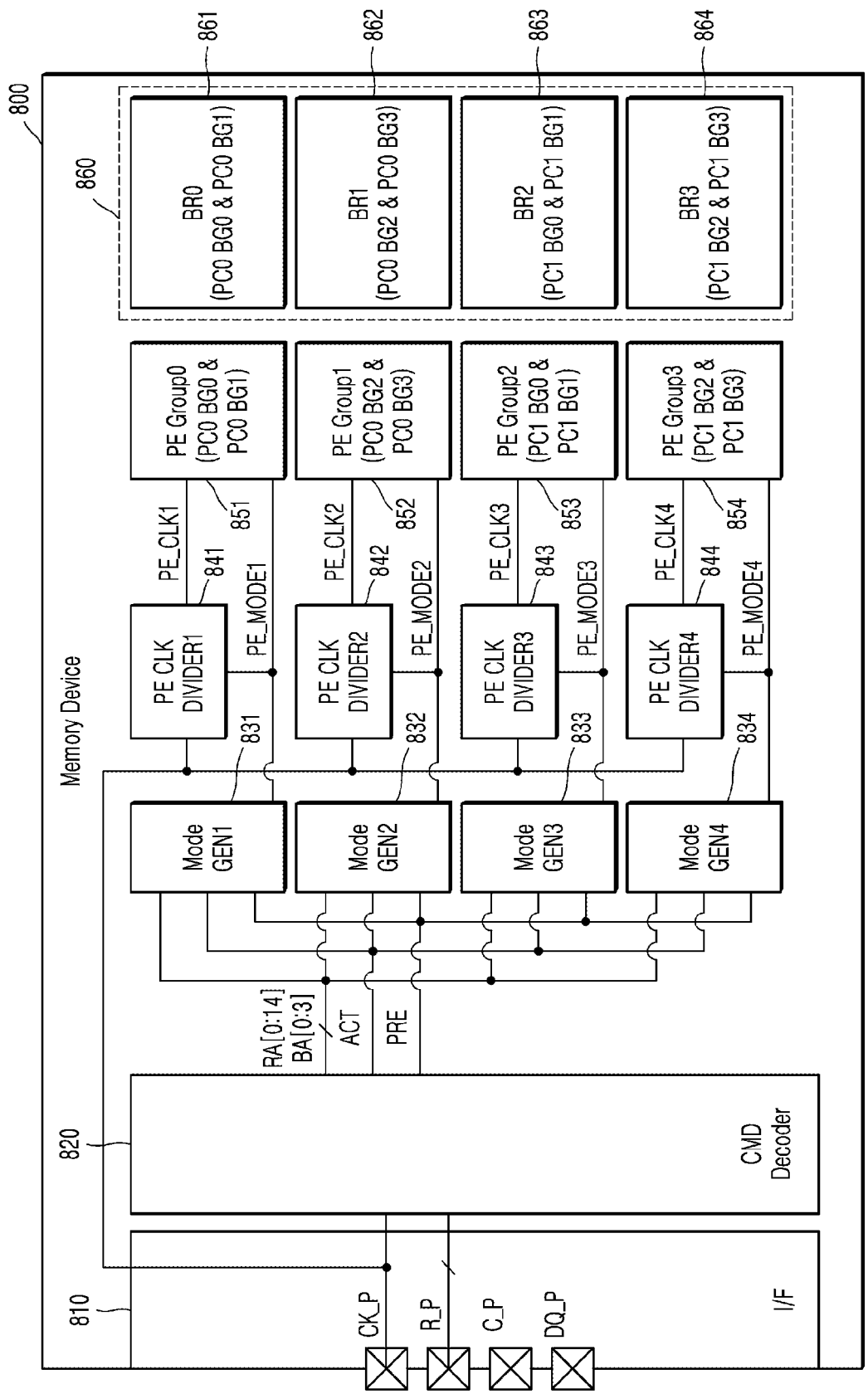
FIGS. 15 and 16 are diagrams illustrating an implementation example and an operation example of a memory device according to another example of the present inventive concept, respectively.
Figure 16:
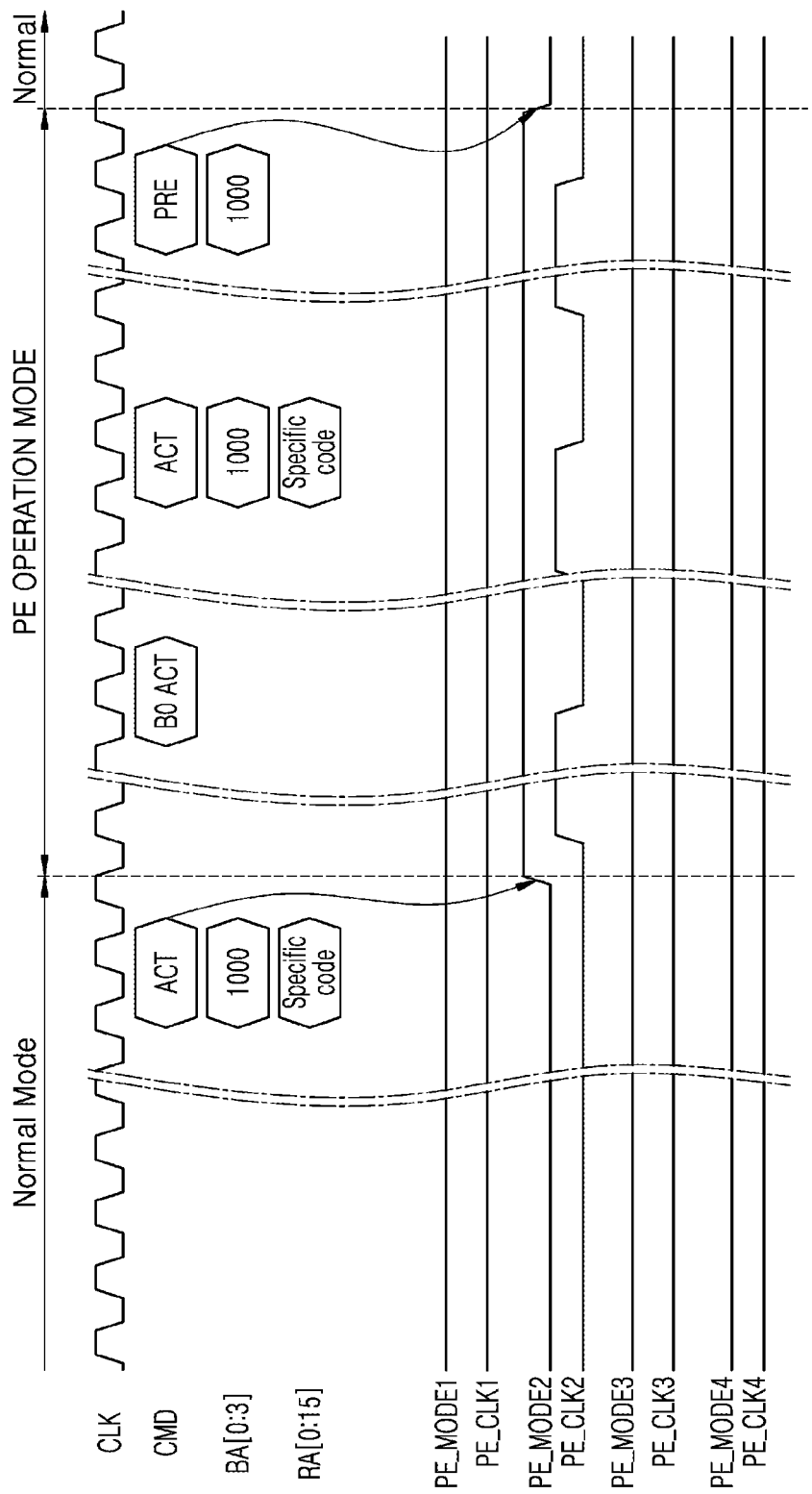

FIGS. 15 and 16 are diagrams illustrating an example of implementation and an example of operation of a memory device, respectively, according to another example embodiment of the present inventive concept. FIGS. 15 and 16 illustrate various commands/addresses that may be used for mode setting.

Referring to FIG. 15, a memory device 800 may include an interface circuit 810, a command decoder 820, and a memory cell array 860, and the memory cell array 860 may include first to fourth bank regions 861 to 864. Further, corresponding to the first to fourth bank regions 861 to 864, first to fourth mode signal generators 831 to 834, first to fourth clock generators 841 to 844, and first to fourth PE groups 851 to 854 may be provided.

The interface circuit 810 may communicate with the memory controller through a clock pin CK_P, a data pin DQ_P, a row pin R_P, and a column pin C_P, and at least one command may be used to set the mode. FIG. 15 illustrates an example in which an active command ACT, a precharge command PRE, and at least one address information are used for mode setting as an example. However, embodiments of the inventive concept are not limited thereto, and mode setting may be performed based on various other types of commands. In addition, as an example, the address information may include a row address RA [0:14] and a bank address BA [0:3] each including one or more bits. According to an implementation example, the row address RA [0:14] and the bank address BA [0:3] may be received through the row pin R_P.

The command decoder 820 may provide the command/address decoding result to the first to fourth mode signal generators 831 to 834, and each of the first to fourth mode signal generators 831 to 834 may generate a mode signal based on the received decoding result. FIG. 16 shows an example of performing operation processing according to a mode set based on the command/address shown in FIG. 15. As an example, in the same manner as in the case of FIG. 13 described above, a case in which the second bank region 762 is set to the operation mode is illustrated.

As an example of operation, entering the operation mode of the bank region may be performed based on the active command ACT and address information. As an example, the bank address BA [0:3] may include information indicating a bank region to enter the operation mode, and the active command ACT and the row address RA [0:14] may function as commands for instructing to enter the operation mode. For example, as at least some bits of the row address RA [0:14] have a specific code, an operation mode entry may be commanded.

The second mode signal PE_MODE2 and the second driving clock signal PE_CLK2 may be activated based on the received command/address, and at least one active command B0 CMD may be received. In addition, a command for exiting from the operation mode may be defined. As an example, as the active command ACT and the precharge command PRE are sequentially received, the bank region may be changed to a normal mode. For example, exit from the operation mode may be commanded by a specific code of at least some bits of the active command ACT and the row address RA [0:14], and then the mode may be changed in response to receiving the precharge command PRE. In addition, the bank address BA [0:3] may indicate a bank region to exit from the operation mode.

According to the embodiments shown in FIGS. 15 and 16 above, apart from setting the mode register, modes for the bank regions may be set using specific bits of the bank address and row address along with various commands such as an active command ACT and a precharge command PRE, and an exit from the operation mode may be set.

Figure 17:
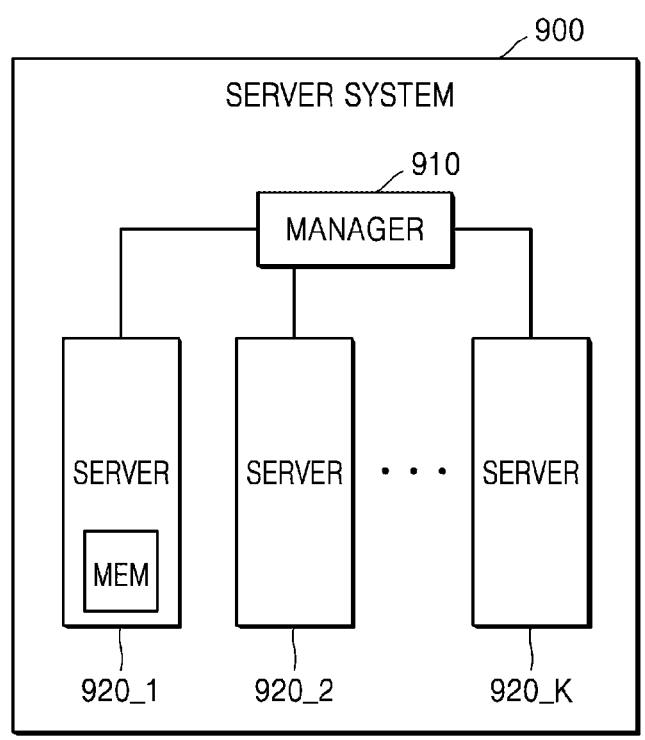
FIG. 17 is a block diagram illustrating a server system including a data processing system according to an embodiment of the present inventive concept.

FIG. 17 is a block diagram showing a server system including a data processing system according to an embodiment of the inventive concept.

Referring to FIG. 17, a server system 900 may include a manager 910 and a plurality of servers 920_1 to 920_K. Each of the plurality of servers 920_1 to 920_K may correspond to the data processing system in the above-described embodiments. A plurality of servers 920_1 to 920_K are connected to each other through a bus supporting a predetermined protocol (e.g., PCI, PCIe, etc.), and as an example, the plurality of servers 920_1 to 920_K may communicate with each other through a P2P connection structure based on the control of the manager 910.

Referring to any one server (e.g., the first server 920_1), the first server 920_1 may include a host and one or more memory devices MEM according to the above-described embodiments, and may perform various types of operation processing according to the function of the server and store the processing result. According to an embodiment, each of the memory devices MEMs may include a plurality of banks and processing elements arranged corresponding thereto, and may perform operation processing through host control and/or self-control. According to the above-described embodiments, a plurality of banks of the memory device MEM may be classified into at least two bank regions, and the operation mode may be set for each bank region. That is, some bank regions may perform operation processing as they are set to the operation mode, and others may perform memory operations as they are set to the normal mode. Also, the memory device MEM may change the mode based on the MRS setting as described above or change the mode based on decoding of a command/address. In various embodiments, the server system 900 may correspond to a neural network server system, and the first server 920_1 may perform a control operation on the memory device MEM so that at least some of the operations may be performed by the memory device MEM in performing a vast amount of neural network operations.

Figure 18:
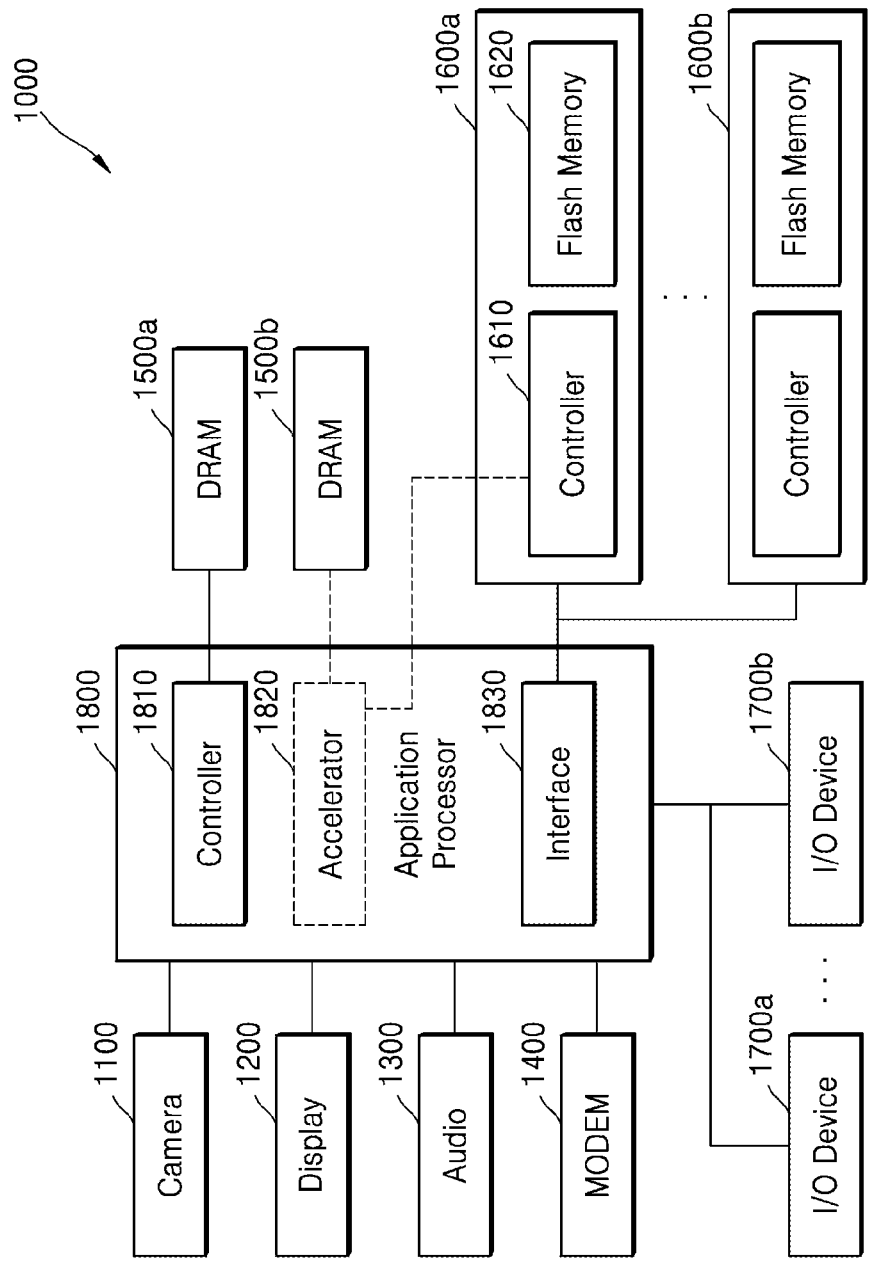
FIG. 18 is a block diagram illustrating a mobile system including a memory device according to an embodiment of the present inventive concept.

FIG. 18 is a block diagram illustrating a mobile system 1000 to which a memory device according to an embodiment of the present disclosure is applied.

Referring to FIG. 18, the mobile system 1000 may include a camera 1100, a display 1200, an audio processing unit 1300, a network processor 1400, a DRAM 1500a, 1500b, a flash memory device 1600a and 1600b, and I/O devices 1700a and 1700b, and an application processor (hereinafter referred to as AP) 1800 may be included. The mobile system 1000 may be implemented as a laptop computer, a mobile phone, a smartphone, a tablet personal computer (PC), or a wearable computer. In addition, the mobile system 1000 may be implemented as a server or a personal computer.

The camera 1100 may capture a still image or a moving picture according to the user's control. The camera 1100 may be implemented in plural, such as a front camera and a rear camera. The display 1200 may be implemented in various forms such as a liquid crystal display (LCD), an organic light emitting diodes (OLED) display, an active-matrix organic light-emitting diode (AM-OLED), and a plasma display panel (PDP). The audio processing unit 1300 may process audio data included in content stored in the flash memory devices 1600a and 1600b. For example, the audio processing unit 1300 may perform various processing such as decoding, amplification, noise filtering, and the like on audio data.

The network processor 1400 may be a processor configured to process network data. The network processor 1400 may perform functions, such as header parsing, pattern matching, bit field manipulation, table lookup, packet ordering management, packet modification, and data movement. The I/O devices 1700a and 1700b may include devices that provide digital input and output functions such as USB or storage, digital cameras, SD cards, touch screens, DVDs, modems, and network adapters.

The AP 1800 controls the overall operation of the mobile system 1000. In detail, the AP 1800 may control the display 1200 to display a part of the contents stored in the flash memory devices 1600a and 1600b on the display 1200. Further, when a user input is received through the I/O devices 1700a and 1700b, the AP 1800 may perform a control operation corresponding to the user input.

The AP 1800 may be provided as a system-on-chip (hereinafter referred to as SoC) that drives an application program, an operating system (OS), and the like. The kernel of an operating system driven by the SoC may include an I/O scheduler and a device driver for controlling the flash memory devices 1600a and 1600b. The device driver may control the access performance of the flash memory devices 1600a and 1600b by referring to the number of synchronization queues managed by the I/O scheduler, or control the CPU mode and Dynamic Voltage and Frequency Scaling (DVFS) level inside the SoC.

According to an embodiment, the mobile system 1000 may include a plurality of DRAMs 1500a and 1500b. In one embodiment, the AP 1800 may embed a controller 1810, and accordingly, the DRAM 1500a may be directly connected to the AP 1800. In one embodiment, the AP 1800 may include an NPU block or an NPU chip 1820 including a Neural Processing Unit (NPU), which is a dedicated circuit for AI data operation, and accordingly, the DRAM 1500b may be additionally mounted on the NPU block or the NPU chip 1820.

The DRAMs 1500a and 1500b have a relatively smaller latency and bandwidth than the I/O devices 1700a and 1700b or the flash memory devices 1600a and 1600b. The DRAMs 1500a and 1500b are initialized at the time the mobile system 1000 is powered on, and the operating system and application data may be loaded and used as a temporary storage place for the operating system and application data, or may be used as an execution space for various software codes. The mobile system 1000 frequently performs a multitasking operation of simultaneously loading a plurality of applications, and a switching and execution speed between applications is used as a performance index of the mobile system 1000.

In the DRAMs 1500a and 1500b, four arithmetic operations of add/subtract/multiply/divide, vector operations, address operations, or FFT operations may be performed. In addition, a function used for inference may be performed in the DRAMs 1500a and 1500b. Here, the inference may be performed in a deep learning algorithm using an artificial neural network. The deep learning algorithm may include a training step of learning a model through various data and an inference step of recognizing data with the trained model. For example, functions used for inference include a hyperbolic tangent function, a sigmoid function, and a rectified linear unit (ReLU) function. For example, in the DRAM 1500b, a function used for the reference may be performed, and the NPU block or NPU chip 1820 may perform AI data operation based on data stored in the DRAM 1500b.

Depending on the embodiment, the mobile system 1000 may include a plurality of storage devices or a plurality of flash memory devices 1600a and 1600b. In one embodiment, the AP 1800 may include an interface 1830, and accordingly, the flash memory devices 1600a and 1600b may be directly connected to the AP 1800. For example, the AP 1800 may be implemented as an SoC, the flash memory device 1600a may be implemented as a separate chip, and the AP 1800 and the AP 1800 and the flash memory device 1600a may be assembled into a single package. However, the inventive concept is not limited thereto, and the plurality of flash memory devices 1600a and 1600b may be electrically connected to the mobile system 1000 through a connection.

The flash memory devices 1600a and 1600b may store photos taken through the camera 1100 or may store data transmitted through a data network, for example, augmented reality/virtual reality, high definition (HD) or 4K ultra high definition (UHD) content.

The flash memory 1620 and/or the memory controller 1610 may be mounted using various types of packages. For example, the flash memory 1620 and/or the memory controller 1610 may be mounted using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package packages such as (WSP), or the like.

The DRAM 1500a may correspond to the memory device described above with reference to FIGS. 1 to 16, and may include a processing element PE. Also, the controller 1810 may correspond to the memory controller described above with reference to FIGS. 1 to 16. For example, a user may photograph an object through the camera 1100, and accordingly, the mobile system 1000 may perform image signal processing on an image of the object input through the camera 1100. Hereinafter, an operation of the mobile system 1000 related to image signal processing will be described.

The controller 1810 in the AP 1800 may determine an operation mode for each bank region according to the above-described embodiments and may provide setting information indicating the determined mode to the DRAM 1500a. The DRAM 1500a may control the mode setting of the bank regions based on the setting information, and at least some of the bank regions provided in the DRAM 1500a may enter the operation mode.

For example, processing elements PEs included in the DRAM 1500a may perform data operation related to an object image input through the camera 1100 and may provide the operation result to the controller 1810. The AP 1800 may generate an object recognition result related to an object image based on an operation result received from the controller 1810 and provide the generated object recognition result to the I/O device 1700a. For another example, processing elements PEs included in the DRAM 1500a may generate an object recognition result by performing a data operation related to an object image input through the camera 1100, and may provide the generated object recognition result to the controller 1810. The AP 1800 may provide the object recognition result received by the controller 1810 to the I/O device 1700a.

While the inventive concept has been particularly shown and described with reference to embodiments thereof, it will be understood that various changes in form and details may be made therein without departing from the spirit and scope of the following claims.

What is claimed is:

1. A memory device comprising:
a memory cell array including a first bank region and a second bank region each including a plurality of banks;
an operation logic including one or more first processing elements (PEs) corresponding to the first bank region and one or more second PEs corresponding to the second bank region;
a control logic configured to control modes of the first bank region and the second bank region based on externally sourced setting information ;
a first mode signal generator configured to generate a first mode signal for enabling the first PEs, based on the control of the control logic; and
a second mode signal generator configured to generate a second mode signal for enabling the second PEs, based on the control of the control logic,
wherein, the first mode signal generator is configured to output the first mode signal to enable the first PEs and the second mode signal generator is configured to output the second mode signal to disable the second PEs responsive to the first bank region being set to an operation mode and the second bank region being set to a normal mode.

2. The memory device of claim 1, wherein the first bank region includes a plurality of first banks, the second bank region includes a plurality of second banks,
in response to an externally sourced active command, at least two first banks of the first bank region are activated together, and
in response to the externally sourced active command, one bank of the second bank region is selectively activated.

3. The memory device of claim 1, wherein the first PEs are configured to perform in parallel an operation using data read from activated rows of the at least two first banks in the first bank region.

4. The memory device of claim 1, wherein the first PEs are configured to perform operation processing in parallel with data access to the second bank region.

5. The memory device of claim 1, wherein the control logic is configured to receive setting information of which a value is changed, and to set both the first and second bank regions to the operation mode or to the normal mode based on the changed setting information.

6. The memory device of claim 1, wherein the control logic includes a mode register set (MRS) including a plurality of mode registers and a command decoder for decoding an externally sourced command/address, and is configured to store a received command (OP) code in the MRS as the setting information.

7. The memory device of claim 6, further comprising: an interface circuit configured to receive the externally sourced command/address,
wherein the interface circuit includes a row pin for receiving a row signal and a column pin for receiving a column signal, and the interface circuit is configured to receive the setting information through the column pin.

8. The memory device of claim 6, wherein the control logic is configured to commonly provide the OP code to the first mode signal generator and the second mode signal generator, and in response to the OP code, the first mode signal generator is configured to generate the first mode signal and the second mode signal generator is configured to generate the second mode signal.

9. The memory device of claim 1, wherein the control logic is configured to control modes of the first bank region and the second bank region based on a combination of at least one of an active command and a precharge command, and a row address.

10. The memory device of claim 9, wherein the control logic further configured to receive a bank address, and to select a bank region to enter the operation mode based on information of the bank address.

11. The memory device of claim 1, further comprising: a first clock generator configured to provide a driving clock signal to the first processing elements PEs, and a second clock generator configured to provide a driving clock signal to the second PEs, wherein, in response to the first mode signal, the first clock generator is configured to provide the driving clock signal to the first PEs, and in response to the second mode signal, the second clock generator is configured to block the driving clock signal from being provided to the second PEs.

12. A memory device in communication with a memory controller, the memory device comprising:
a memory cell array including a first bank region and a second bank region, each bank region including a plurality of banks;
an operation logic including one or more first processing elements (PEs) corresponding to the first bank region and one or more second PEs corresponding to the second bank region;
an interface circuit configured to interface with the memory controller and receive setting information for setting modes of the first bank region and the second bank region from the memory controller; and
a control logic configured to set the first bank region to an operation mode and the second bank region to a normal mode, in response to receiving the setting information having a first value,
wherein, based on the control of the control logic, the first PEs are configured to perform operation processing in parallel with data access to the second bank region.

13. The memory device of claim 12, further comprising: a mode register set (MRS) including a plurality of mode registers for setting an operating environment of the memory device, wherein the control logic is configured to store the received setting information in the MRS.

14. The memory device of claim 13, wherein in response to receipt of a setting information having a second value, the setting information having the second value is updated in the MRS, and the control logic is configured to set both the first and second bank regions to an operation mode or to a normal mode in response to receiving the setting information having the second value.

15. The memory device of claim 12, further comprising:
a first mode signal generator configured to generate a first mode signal for controlling the enable of the first PEs based on the control of the control logic;
a second mode signal generator configured to generate a second mode signal for controlling the enable of the second PEs based on the control of the control logic;
a first clock generator configured to provide a driving clock signal to the first processing elements PEs in response to the first mode signal; and
a second clock generator configured to provide a driving clock signal to the second PEs in response to the second mode signal,
wherein, in response to the first mode signal, the first clock generator is configured to provide the driving clock signal to the first PEs, and in response to the second mode signal, the second clock generator is configured to block the driving clock signal from being provided to the second PEs.

16. A memory device in communication with a memory controller, the memory device comprising:
a buffer die in communication with the memory controller; and
one or more core dies stacked on the buffer die, each of the core dies including a plurality of channels,
wherein each channel includes:
a memory cell array including a plurality of bank regions, each bank region including a plurality of banks;
an operation logic including a plurality of processing element (PE) groups arranged corresponding to the plurality of bank regions, each PE group including one or more processing elements (PEs);
a plurality of mode generators arranged corresponding to the plurality of PE groups and each configured to generate a mode signal for enabling the PEs of the corresponding PE group; and
a control logic configured to control modes of the plurality of bank regions based on setting information provided from the memory controller,
wherein some of the plurality of bank regions are set to an operation mode and others are set to a normal mode, and the PE groups corresponding to the bank regions set to the operation mode are configured to perform an operation in parallel with performance of data access on the bank regions set to the normal mode.

17. The memory device of claim 16, further comprising: a plurality of clock generators arranged corresponding to the plurality of PE groups, wherein each of the plurality of clock generators, in response to a mode signal from a corresponding mode generator, is configured to provide a driving clock signal or is configured to block the driving clock signal from being provided, to a corresponding PE group.

18. The memory device of claim 17, wherein each of the channels is classified into a first pseudo channel and a second pseudo channel, and the bank region of the second pseudo channel is set to the normal mode while the bank region of the first pseudo channel is set to the operation mode.

19. The memory device of claim 17, wherein each of the channels is classified into a first pseudo channel and a second pseudo channel, and while some bank regions of the first pseudo channel are set to the operation mode, some other bank regions of the first pseudo channel are set to the normal mode.

20. The memory device of claim 17, wherein, if the core dies, at least one first bank region of a first core die and at least one second bank region of a second core die are set to the same channel, and the modes of the first bank region and the second bank region are set identically or differently according to the setting information.

* * * * *